United States Patent [19]
Suzuki et al.

[11] Patent Number: 6,108,243
[45] Date of Patent: Aug. 22, 2000

[54] HIGH-SPEED RANDOM ACCESS MEMORY DEVICE

[75] Inventors: Takaaki Suzuki; Shinya Fujioka; Yasuharu Sato, all of Kawasaki, Japan

[73] Assignee: Fujitsu Limited, Kawasaki, Japan

[21] Appl. No.: 09/383,014

[22] Filed: Aug. 25, 1999

[30] Foreign Application Priority Data

Aug. 26, 1998 [JP] Japan .................................. 10-240722
Aug. 5, 1999 [JP] Japan .................................. 11-221957

[51] Int. Cl.[7] ..................................................... G11C 7/00
[52] U.S. Cl. ..................... 365/189.01; 365/220; 365/205; 365/230.06
[58] Field of Search .............................. 365/189.01, 220, 365/205, 230.06

[56] References Cited

U.S. PATENT DOCUMENTS

| | | | |
|---|---|---|---|
| 5,886,946 | 3/1999 | Ooishi | 365/233 |
| 5,892,730 | 4/1999 | Sato et al. | 365/233 |
| 5,959,930 | 9/1999 | Sakurai | 365/230.03 |
| 5,973,991 | 10/1999 | Tsuchida et al. | 365/233 |
| 5,978,246 | 11/1999 | Shindo | 365/49 |
| 6,028,810 | 2/2000 | Ooishi | 365/230.03 |

*Primary Examiner*—Viet Q. Nguyen
*Attorney, Agent, or Firm*—Arent Fox Kintner Plotkin & Kahn, PLLC

[57] ABSTRACT

The present invention is an FCRAM comprising a first stage for performing command decoding, a second stage for performing sense amplifier activation, and a third stage for performing data input and output, configured in a pipeline structure, a plurality of data bits being transferred in parallel between the sense amplifiers and the third stage, wherein sense amplifiers are deactivated automatically and a reset operation is performed after data has been transferred in parallel between sense amplifiers and the third stage, in response to a standard read or write command.

12 Claims, 21 Drawing Sheets

FIG. 1 FCRAM

Memory Core

First Embodiment

Write Operation of The First Embodiment

FIG.11 Write Operation (High-speed Data Input) of The First Embodiment

Second Embodiment

FIG.14 Write Operation of The Second Embodiment

FIG. 15 Third Embodiment

Read Operation of Third Embodiment

Write Operation of The Third Embodiment

Timing Chart of Fig. 18

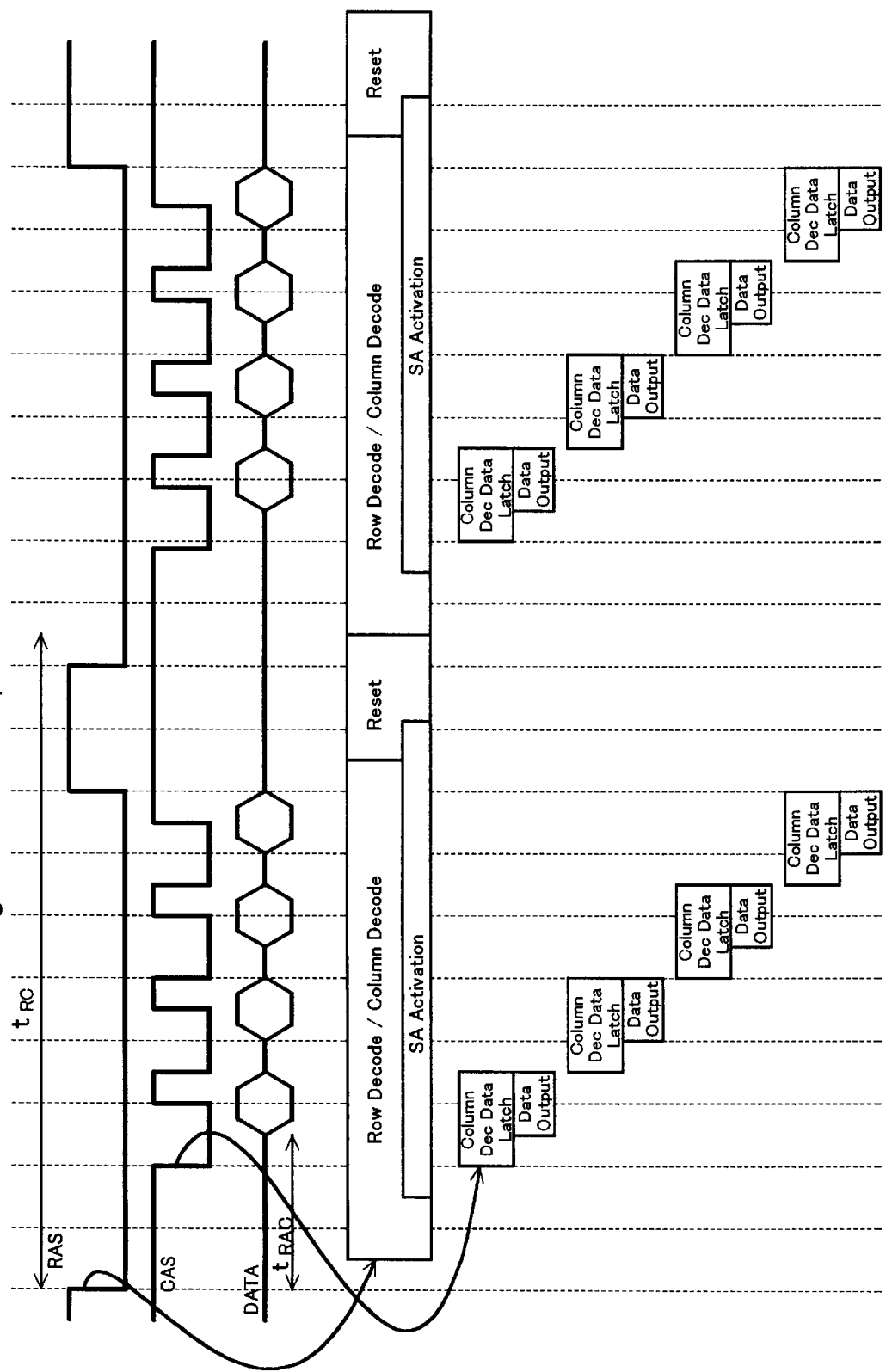

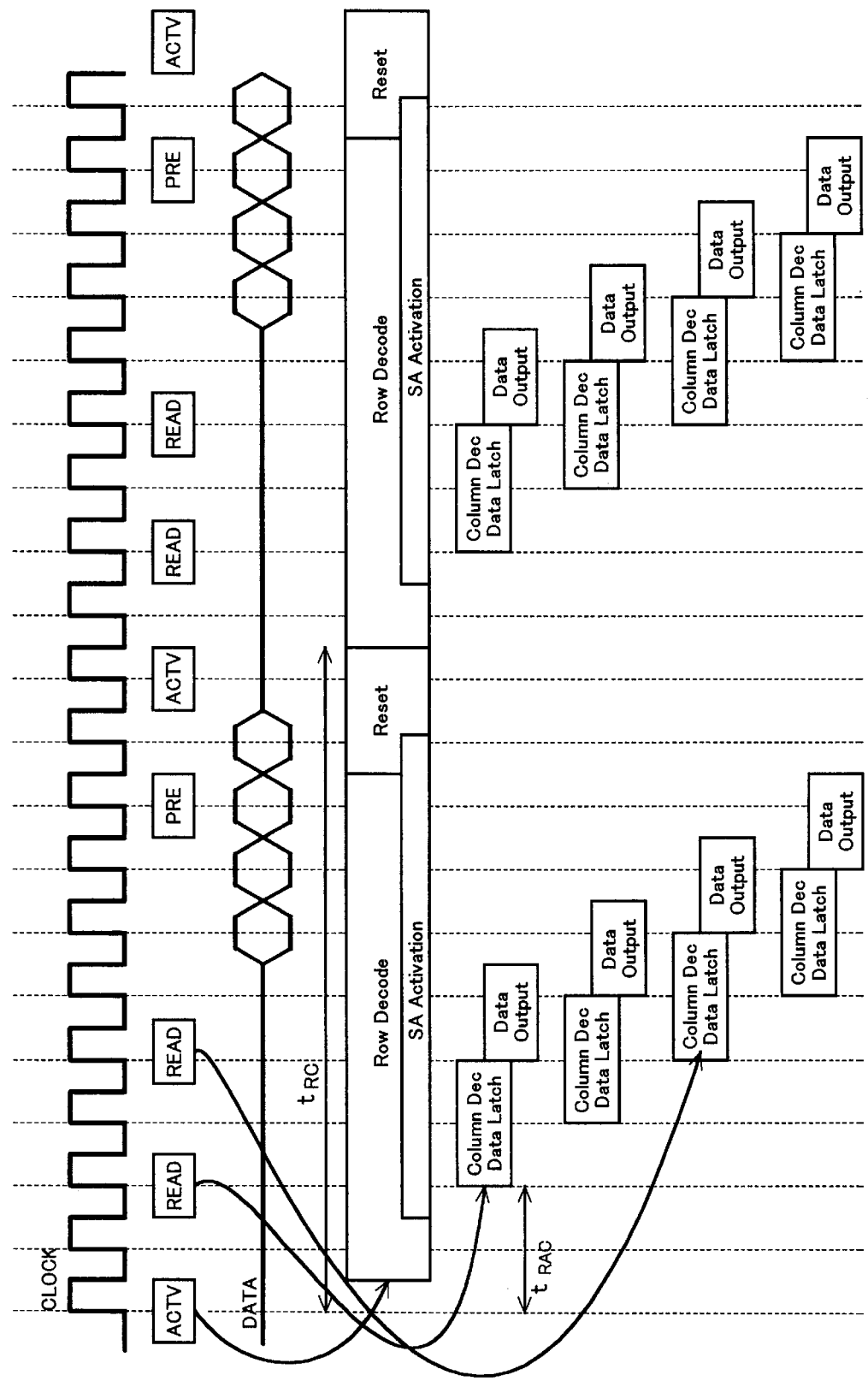

HIGH-SPEED RANDOM ACCESS MEMORY DEVICE

BACKGROUND OF THE INVENTION

1. Field of the Invention

The present invention relates to a fast cycle RAM or FCRAM (Fast Cycle Random Access Memory, application for registration trademark pending by Fujitsu Co. Ltd.) whereby the random address cycle can be shortened, and in particular, to an FCRAM which is capable of switching between column access mode and random access mode.

2. Description of the Related Art

In a conventional DRAM, data is read out from a memory cell to sense amplifiers by operating a row circuit in response to a row address and activating a word line and sense amplifiers, whereupon a column circuit is operated in response to a column address, and data is output from the selected sense amplifiers. When data output has been completed, reset operations or precharge operations are conducted in the row circuit and the column circuit. Therefore, generally, it is necessary to maintain the word line and the sense amplifiers in an activated state until the required data output has been completed, and hence it has not been possible to shorten the cycle time of the random access operation (random address cycle time) involved in changing the row address.

FIG. 20 is a timing chart illustrating a page mode read operation in a conventional DRAM. In page mode in a conventional DRAM, a row address is supplied in synchronism with a row address strobe signal RAS, a row decode operation is activated, a single work line is activated, and a plurality of data bits are output by means of a toggle operation of a column address strobe signal CAS, whilst sense amplifiers latch the corresponding data. A column addresses are generated internally each time the column address strobe signal CAS performs a toggle operation, and hence plural data are output in a continuous fashion. Consequently, the virtual sequence access time tRAC is shortened by means of the data in memory cells connected to the same word line being output continuously from a row of sense amplifiers in an activated state.

FIG. 21 is a timing chart illustrating a read operation in a conventional synchronous DRAM (SDRAM) in burst mode. FIG. 21 shows a case where the burst length is 2. In this read operation, a row decoder is activated and a single word line is activated, in response to an active command ACTV issued in synchronism with the rising edge of a clock CLOCK. Thereupon, whilst the sense amplifiers are activated and latch the corresponding data, a column decoder is activated in response to a read command READ and data is latched in a CAS circuit and then output. Since the burst length is 2, two data bits are output consecutively for each READ command. Thereupon, in response to the subsequent read command READ, the operations of activating the column decoder with respect to the relevant column address, and then latching and outputting the data, are carried out in a continuous fashion.

In the case of a synchronous DRAM, the column decode and data latch operations for consecutive read commands can be overlapped each other by using a pipeline structure inside the circuit for column system, and the data output is speeded up accordingly.

In the case of either of the two readout operations described above, a plurality of data bits on the same word line can be read out at high speed by first activating a word line and activating sense amplifiers in accordance with a row address, and holding the corresponding data, whilst repeating the CAS system operation. In a write operation, essentially, a single word line is activated, and a plurality of write data bits are written to the memory cells of this word line via sense amplifiers.

Therefore, when used in a cache memory, or the like, in a generic system, increases in speed can be achieved even in the conventional readout and write operations described above. However, in cases where the volume of data is very large and the address may shift in any direction, such as the main memory of a supercomputer or three-dimensional graphics applications, it is necessary for the memory device to conduct random access operations at frequent intervals. These random access operations require a long time from activation of a word line until reset of the word line after data readout, and hence they represent an obstacle to achieving high speeds.

Therefore, the present applicants have proposed a fast cycle RAM (FCRAM) which is capable of shortening the cycle time associated with the random access operation. This has been reported, for example, in *Nikkei Electronics*, Jun. 15, 1998, pp. 163–171, or 1998 *SYMPOSIUM ON VLSI CIRCUITS, DIGEST OF TECHNICAL PAPERS*, pp. 22–25. The present applicants have also taken out International Patent Application JP98/02443, dated Jun. 3, 1998.

In this memory device, the random address cycle time has been compressed significantly by changing the memory/core architecture. The basic operation of this device involves continuous implementation of an operational sequence involving the steps of, in response to a single READ or WRITE command, or the like, activating a word line, activating sense amplifiers, latching and outputting data, and performing a reset operation so as to output data for burst length or to write data for burst length. Therefore, the activated state of the word line and sense amplifiers is not maintained unlike the prior art.

In a FCRAM, in order to shorten the random address cycle time, a plurality of data bits corresponding to the burst length is transferred simultaneously from the sense amplifiers to the CAS circuit section with respect to a single output terminal, and moreover, the sense amplifier activation and reset time is shortened by limiting the word line activation and sense amplifier activation to the required sub-cell matrix region only. By constructing the command decode section, the row circuit section and the column circuit section in a pipeline structure, consecutive random access operations can be carried out in such a manner that they overlap with respect to the period.

However, in the proposed FCRAM described above, there only exist three commands: READ, WRITE and REFRESH. And there is no separation of Row operation and Column operation by different commands. Consequently, even in cases where data is read out consecutively from the same word line, it is necessary to repeat an operational sequence from the row decode operation through to the reset operation invoked by different read commands. Therefore, even if, for example, the data output rate or data input rate is higher, the access time and access cycle time cannot be shortened. Moreover, in the aforementioned random access operation, the access time and access cycle time become longer than a case where data held in the sense amplifiers is output like a page mode.

Secondly, since there is only one type of read command for the read operation, it is not possible to distinguish from the read command whether data is to be read out consecutively from the same word line, or whether data from a different word line is to be read out. The same applies in the case of a write operation.

SUMMARY OF THE INVENTION

Therefore, it is an object of the present invention to provide a novel FCRAM which represents a further improvement on conventionally proposed FCRAMS.

It is a further object of the present invention to provide an FCRAM comprising a novel readout mode not implemented in a conventional FCRAM, whereby the access time and access cycle time can be speeded up.

It is a further object of the present invention to provide an FCRAM comprising a novel write mode not implemented in a conventional FCRAM, whereby the access time and access cycle time can be speeded up.

In order to achieve the aforementioned objects, the present invention is an FCRAM comprising a first stage for performing command decoding, a second stage for performing sense amplifier activation, and a third stage for performing data input and output, configured in a pipeline structure, a plurality of data bits being transferred in parallel between the sense amplifiers and the third stage, wherein sense amplifiers are deactivated automatically and a reset operation is performed after data has been transferred in parallel between sense amplifiers and the third stage, in response to a standard read or write command. Thereupon, in response to a second read or write command, which is different to a standard command, the activated state of the sense amplifiers is maintained and the reset operation is not performed automatically, after data has been transferred in parallel between the sense amplifiers and the third stage. In a subsequent read or write operation, the step of activating the sense amplifiers is omitted, and data is transferred from or to the sense amplifiers maintained in an activated state. By adopting this operation, the step of activating a subsequent word line and sense amplifiers can be omitted when performing consecutive readout or write operations to memory cells on the same word line, and hence a plurality of data bits can be transferred in parallel at high speed, and the effective cycle time can therefore be shortened.

In a further example of the present invention, moreover, a function is provided for incrementing the column address internally in response to a second read or write command which is different to a standard command. A plurality of data bits are then transferred in parallel from or to sense amplifiers corresponding to the internally incremented column address.

Alternatively, in a further example of the present invention, if read or write commands having the same row address are supplied consecutively within a shorter timing, then a reset operation including deactivation of the sense amplifiers after data transfer is not implemented. According to this operation, it is not necessary to specify a special second read or write command.

In order to achieve the aforementioned objects, the present invention is a memory device comprising a first stage for performing command decoding, a second stage for performing sense amplifier activation, and a third stage for performing data input and output, configured in a pipeline structure, a plurality of data bits being transferred in parallel between the sense amplifiers and the third stage; wherein the second stage deactivates the sense amplifiers so as to perform a reset operation, after data has been transferred in parallel between the sense amplifiers and the third stage, in response to a first read or write command; and the second stage maintains the activated state of the sense amplifiers so as not to perform the reset operation, after data has been transferred in parallel between the sense amplifiers and the third stage, in response to a second read or write command.

According to the invention described above, by using the second read or write command, it is possible to omit a new word line and sense amplifier activation step when performing a subsequent readout or write operation to a memory cell on the same word line, and hence high-speed operation can be achieved.

In order to achieve the aforementioned objects, the present invention is a memory device comprising a first stage for performing command decoding, a second stage for performing sense amplifier activation, and a third stage for performing data input and output, configured in a pipeline structure, a plurality of data bits being transferred in parallel between the sense amplifiers and the third stage; wherein the second stage deactivates the sense amplifiers so as to perform a reset operation, after data has been transferred in parallel between the sense amplifiers and the third stage, in response to a first read or write command; and in response to a second read or write command, the second stage maintains the activated state of the sense amplifiers without performing the reset operation, after data has been transferred in parallel between the sense amplifiers and the third stage, and then the column address is incremented and data is transferred in parallel between the third stage and sense amplifiers corresponding to the incremented column address.

According to the invention described above, by using the second read or write commands, it is possible to conduct readout or write operations consecutively to sense amplifiers maintained in an activated state, without supplying a column address, and hence high-speed operation can be achieved.

Moreover, in order to achieve the aforementioned objects, the present invention is a memory device comprising a first stage for performing command decoding, a second stage for performing sense amplifier activation, and a third stage for performing data input and output, configured in a pipeline structure, a plurality of data bits being transferred in parallel between the sense amplifiers and the third stage; wherein the second stage deactivates the sense amplifiers so as to perform a reset operation, after data has been transferred in parallel between the sense amplifiers and the third stage, in response to a read or write command; and when read or write command associated with the same row address is supplied consecutively within a timing shorter than a standard command cycle, the second stage maintains the activated state of the sense amplifiers so as not to perform the reset operation, regardless of the immediate preceding read or write command.

According to the invention described above, by supplying read or write commands with the same row address at a timing different from the normal timing, it is possible to perform a high-speed column access operation, without using special read or write commands.

BRIEF DESCRIPTION OF THE DRAWINGS

FIG. 20 is a timing chart illustrating a readout operation in a conventional DRAM in page mode; and FIG. 21 is a timing chart illustrating a readout operation in a conventional synchronous DRAM (SDRAM) in burst mode.

DESCRIPTION OF THE PREFERRED EMBODIMENTS

Embodiments of the present invention are described below with reference to the drawings. However, the technical scope of the invention is not limited to these embodiments.

Figure 1:
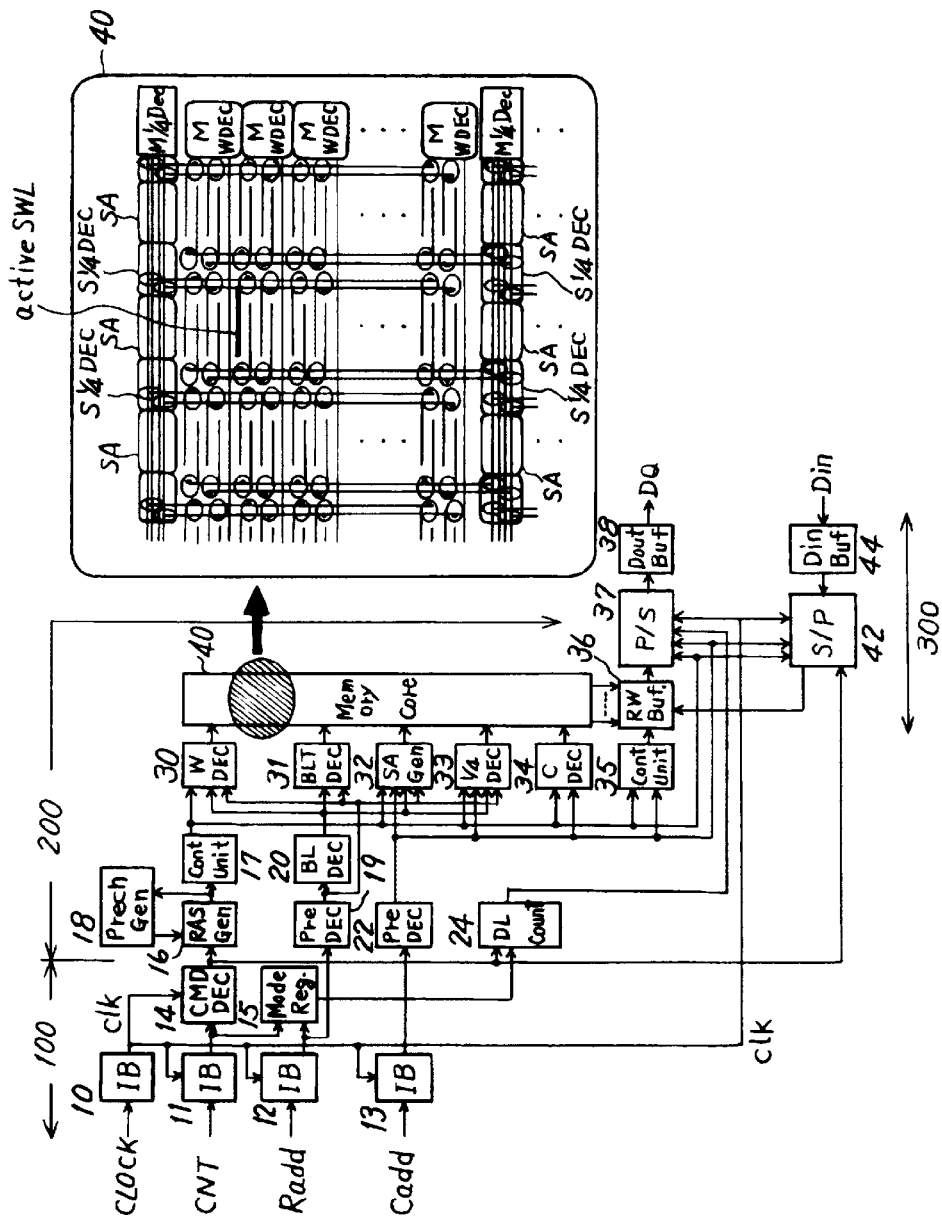
FIG. 1 is a block diagram of an FCRAM.

FIG. 1 is a block diagram of a FCRAM. An external clock CLOCK is supplied to a clock input buffer 10, which outputs an internal clock clk. In response to this internal clock clk, a control signal CNT, row address Radd, and column address Cadd are input respectively to input buffers 11, 12, 13 and latched. Furthermore, in response to the internal clock clk, data is output from a data output terminal DQ and data is input via a data input terminal Din.

The control signal CNT is supplied to a command decoder 14 which decodes commands. In the initial state, a variety of mode set values supplied via the row address terminal Radd are latched by a mode register 15 in response to the control signal CNT. During normal operation, the control signal CNT is decoded by the command decoder 14, and when RAS activation is detected by an RAS generator 16 in response to the decoded output, the operation of the decoder, and the like, is controlled by a control unit 17. Specifically, this relates to a word decoder 30, bit line transfer gate decoder 31, sense amplifier activation circuit 32, ¼ decoder 33, column decoder 34, column control unit 35, and the like.

The row address signal Radd is latched by the input buffer 12 and then pre-decoded by a word pre-decoder 19. This pre-decoded signal is then supplied to a word decoder 30, bit line transfer gate decoder 31, sense amplifier activation circuit 32, ¼ decoder 33, and block decoder 20.

Moreover, the column address Cadd is latched by the input buffer 13, and pre-decoded by a column pre-decoder 22. This pre-decoded signal is then supplied to a sense amplifier activation circuit 32, ¼ decoder 33, column decoder 34, column control unit 35, and a readout parallel-serial converting circuit 37 and write parallel-serial converting circuit 42.

The FCRAM is divided into a first stage 100 wherein the control signal CNT is decoded and the operational mode is detected, a second stage 200, wherein the row and column address signals Radd Cadd are decoded, the word line and sense amplifiers are activated, and data is output in parallel to a read/write buffer circuit 36, and a third stage 300, wherein the data output in parallel to the read/write buffer circuit 36 is converted to serial data by the parallel-serial converting circuit 37 and output via a data output buffer 38. The third stage 300 also contains a circuit wherein write data is input to the data input buffer 44, serial-to-parallel converted, and then supplied as parallel data to a read/write buffer circuit 36. The first, second and third stages 100, 200, 300 have a pipeline structure and each stage operates independently.

Inside the memory core 40, memory cells each comprising one transistor and one capacitor are positioned at the points of intersection between bit lines and sub-word lines SWL. As described later, the memory core 40 is divided into a plurality of sub-cell matrices in the row direction (horizontal direction in the diagram), and sense amplifiers SA are provided in each respective sub-cell matrix. Therefore, a column address is used to select a sub-cell matrix. Hence, a main word decoder 30 selects a main word line in accordance with a row address, and of the sub-word lines connected to that main word line, only the sub-word line in the selected sub-cell matrix is activated. Similarly, within the selected sub-cell matrix, only the sense amplifiers corresponding to the selected sub-word line are activated by the sense amplifier activation circuit 32.

The operation involved in readout from the memory core 40 is similar to that in a generic DRAM. In other words, the sub-word line in the selected sub-cell matrix belonging to the main word line is activated. The data in the memories on these activated sub-word line is read out to bit lines, amplified and latched by activation of the sense amplifiers. The data latched by the sense amplifiers is/are then output in parallel to the read/write buffer 36, in accordance with the burst length. Thereupon, it is converted to serial data by the parallel/serial converting circuit 37, and output in a consecutive fashion from the data output buffer 38. The parallel/serial converting circuit 37 conducts this conversion operation at a timing controlled by a data latency counter 24.

The second stage 200, memory core 40 and read/write buffer 36 constitute a single block. Normally, a plurality of such blocks are provided in a memory device. Therefore, a block decoder 20 is provided inside each block, and a signal indicating whether or not a block is to be selected is generated according to the row address signal, and supplied to the word decoder 20, bit line transfer gate decoder 31, sense amplifier activation circuit 32 and ¼ decoder 33.

Figure 2:
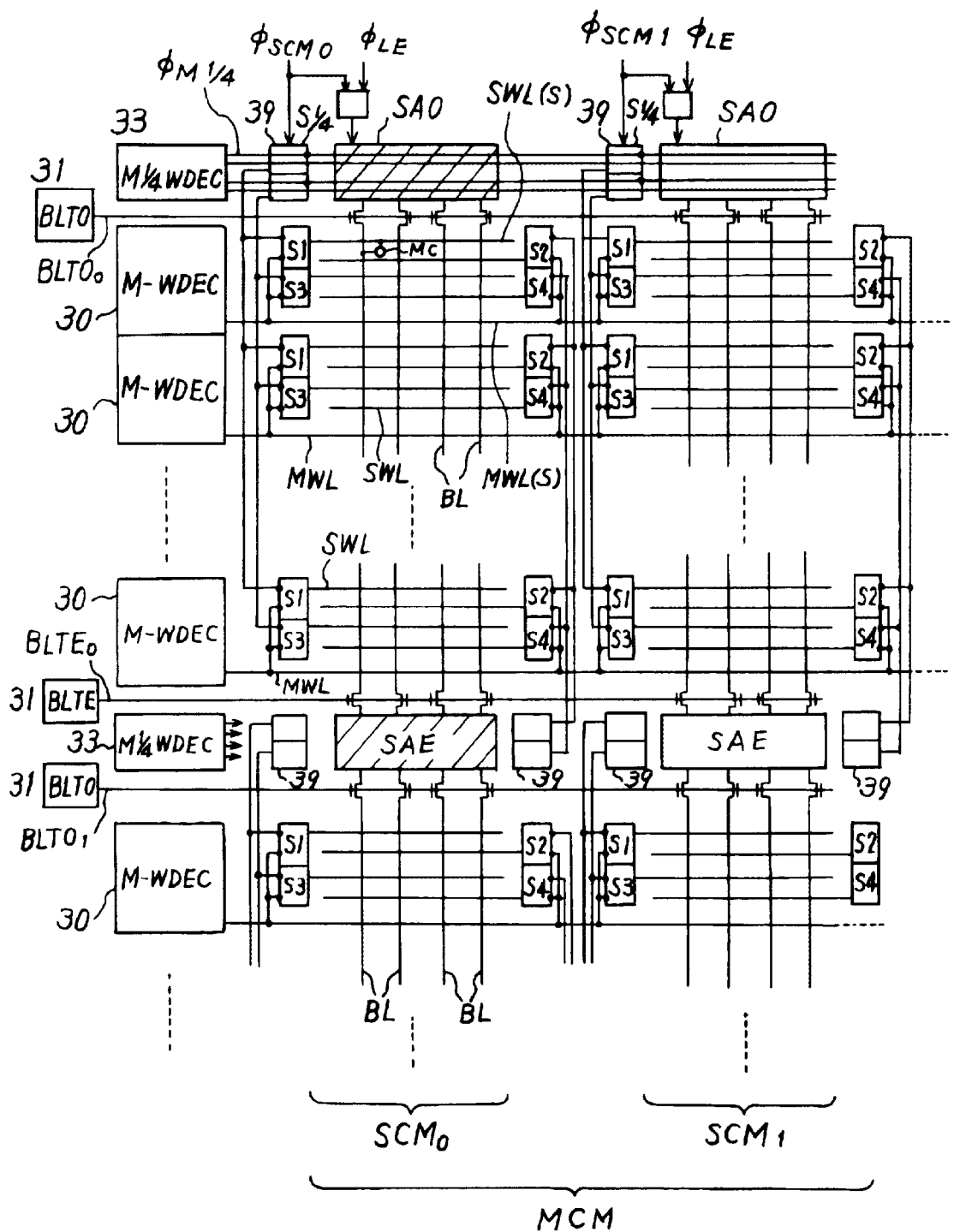
FIG. 2 is a circuit diagram showing the composition of the memory core of an FCRAM.

FIG. 2 is a circuit diagram showing the composition of a memory core 40 in a FCRAM. As described in relation to FIG. 1, in an FCRAM memory core 40, a main cell matrix MCM is divided into a plurality of sub-cell matrices SCM. In FIG. 2, two sub-cell matrices SCM are illustrated.

Accordingly, a sub-cell matrix selection signal $\phi_{SCM}$ is supplied on the basis of the column address. Moreover, in the column direction (vertical direction in the diagram), sense amplifiers SAO, SAE are provided for each of a prescribed number of main word lines MWL. In the example in FIG. 2, relax-type sense amplifiers are used, in which a single sense amplifier is constituted by the sense amplifiers SAO, SAE on either side of a cell matrix.

There follows a description of the selection operation implemented when the memory cell MC in FIG. 2 is selected in the foregoing composition. The main word decoder 30 decodes the row address and activates a main word line MWL(S). (S) means selected one. The main ¼ word decoder 33 also activates a main ¼ decode line $\phi_{M\frac{1}{4}}$ by decoding the row address. At the same time, a sub-cell matrix selection signal $\phi_{SCMO}$ is activated by decoding the column address. The main ¼ decode line $\phi_{M\frac{1}{4}}$ is supplied via a sub ¼ decoder 39 (S¼) receiving the activated sub-cell matrix selection signal $\phi_{SCMO}$, to a sub-word decoder S1 provided in the column direction (vertical direction). Only the sub-word decoder S1 supplied with the activated main word line MWL(S) activates a sub-word line SWL(S). (S) means selected one. In this way, of the plurality of sub-word lines SWL connected to a main word line MWL in the FCRAM memory core, only a portion of the sub-word lines is activated. Consequently, it is possible to shorten the time required for activating word lines.

When a sub-word line SWL(S) is activated, the bit line transfer selection signals BLTOo and BLTEo are activated by the bit line transfer gate decoder 31, and the pair of bit lines BL intersecting with the activated sub-word line SWL (S) are connected to the sense amplifiers SAO, SAE on either side of the sub-cell matrix. Moreover, only a portion of the sense amplifiers SAO, SAE, indicated by shading in the diagram, are activated in response to the sense amplifier activation signal $\phi_{LE}$ and the sub-cell matrix selection signal $\phi_{SCMO}$. Therefore, the time required for activating the sense amplifiers is reduced.

The data in the sense amplifiers SAO, SAE in the activated sub-cell matrix SCMO, are output in 4-bit units, for example, to the read/write buffer 36. In other words, the supplied column address is decoded by the column decoder 34 and 4-bit data are output in parallel to the read/write buffer 36 in response to a column selection signal (not illustrated). The 4-bit data latched by the read/write buffer 36 are further transferred to the parallel-serial converting circuit 37. The required number of data bits are converted to serial data in accordance with the specified burst length and then output via the data output buffer 38.

In other words, a plurality of data bits corresponding at least to the burst length, are output in parallel from the sense amplifiers to the read/write buffer 36 for one data output terminal. Consequently, after a plurality of data bits corresponding to the burst length have been output together to the read/write buffer 36, the sub-word line is immediately deactivated, the cell transistors in the memory cells are closed, and the sense amplifiers can be deactivated, thereby allowing the device to proceed to the random access operation in the next cycle. Therefore, the second stage 200 is able to transfer to the subsequent word line and sense amplifier activation operation, without waiting for the parallel-serial conversion and data output operations in the third stage to be completed. Accordingly, the operational cycle of the second stage has a fixed time period, irrespective of the burst length, and it can be reset automatically.

Figure 3:
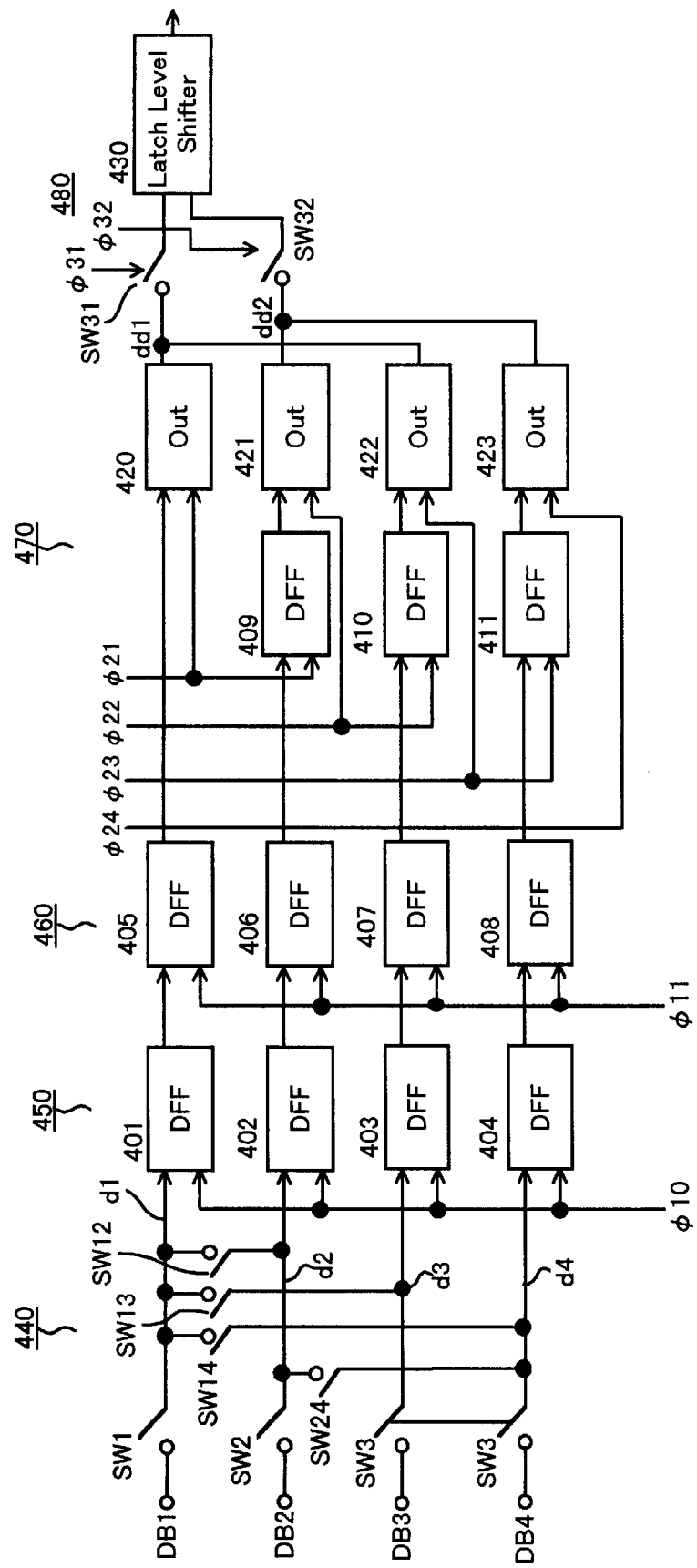
FIG. 3 is a compositional diagram of a parallel-serial converting circuit.

FIG. 3 is a diagram of a composition of a parallel-serial converting circuit. As described above, the parallel-serial converting circuit 37 outputs the required number of data bits as serial data, in accordance with the specified burst length. For example, 4-bit data supplied in parallel from the read/write buffer 36 are output respectively as 1-bit, 2-bit or 4-bit serial data in response to a 2-bit column address and 1, 2, 4-bit burst lengths.

A data bus switch 440 transfers data on the four data buses DB1–4 to nodes d1–d4, according to the column address and burst length. A master flip-flop 450 latches the data at d1–d4 in response to a control signal $\phi10$, and a slave flip-flop 460 latches the data latched by the master flip-flop 450 in response to a control signal $\phi11$. A 4-2 converting section 470 outputs the 4-bit data to nodes dd1, dd2, two bits at a time, according to the column address and burst length. A 2-1 converting section 480 supplies the 2-bit data from nodes dd1 and dd2, successively, one bit at a time, to a latch level shifter circuit 430, in accordance with the burst length.

If the burst length is 4, then switches SW1, 2, 3 in the data bus switch 440 are switched on simultaneously, and the four data buses DB1–DB4 are supplied directly to nodes d1–d4. The data is then latched by the master flip-flop 450 and slave flip-flop 460. Thereupon, in response to a control signal $\phi21$, the data at node d1 is latched by an output register 420, and the data at node d2 is latched by a flip-flop 409. Thereupon, in response to a control signal $\phi22$, the data in flip-flop 409 is latched by an output register 421 and the data at node d3 is latched by a flip-flop 410. In this case, in response to a control signal $\phi31$, the first data output from the output register 420 is supplied from node dd1 via switch SW31 to the latch level shifter circuit 430.

Moreover, in response to a control signal $\phi23$, the data in flip-flop 410 is latched in an output register 422, and the data at node d4 is latched in flip-flop 411. Here, in response to a control signal $\phi32$, the second data output from the output register 421 is supplied from node dd2, via switch SW32, to the latch level shifter circuit 430. Thereupon, in response to a control signal $\phi24$, the data in the flip-flop 411 is latched in an output register A23. Here, in response to a control signal $\phi31$, a third output from the output register 422 is supplied from dd1 via switch SW31 to the latch level shifter circuit 430. Finally, in response to a control signal $\phi32$, the fourth data in output register 423 is supplied from node dd2 via switch SW32 to the latch level shifter circuit 430.

Next, a case where the burst length is 2 will be described. If the burst length is 2, then either one of the data buses DB1, DB2 and the data buses DB3, DB4 are output to nodes d1, d2, depending on the column address. Therefore, according to the column address, either one of two states is selected, namely, a first state where switches SW1, SW2 are on and switches SW3, SW14, SW24 are off, or a second state where switches SW1, SW2 are off and switches SW3, SW14, SW24 are on. If the first state is selected, the data on data buses DB1 and DB2 are supplied to nodes d1, d2, and if the second state is selected, the data on data buses DB3 and DB4 are supplied to nodes d1, d2.

Thereupon, the data is latched by the master flip-flop 450 and slave flip-flop 460, and in response to control signal $\phi21$, the data at node d1 is latched by the output register 420, and the data at node d2 is latched by flip-flop 409. In response to control signal $\phi22$, the data in flip-flop 409 is then latched by the output register 421. Here, in response to control signal $\phi31$, the first data in output register 421 is output from node dd1 via switch SW31 to the latch level shifter circuit 430. Thereupon, in response control signal $\phi32$, the second data in output register 421 is output from node dd2 via switch SW32 to the latch level shifter circuit 430.

A case involving a burst length of 1 is now described. In this case, data on the data bus DB selected according to a 2-bit column address is supplied to node d1 via any one of switches SW12, SW13, SW14 in the data bus switch section 440. The 1-bit data is then transferred to flip-flops 401, 405, 420, and supplied via switch SW31 to the latch level shifter circuit 430.

Moreover, although not illustrated in the diagram, if the burst length is 8, then 8-bit data can be output as serial data by outputting 4-bit data respectively from two blocks.

Figure 4:
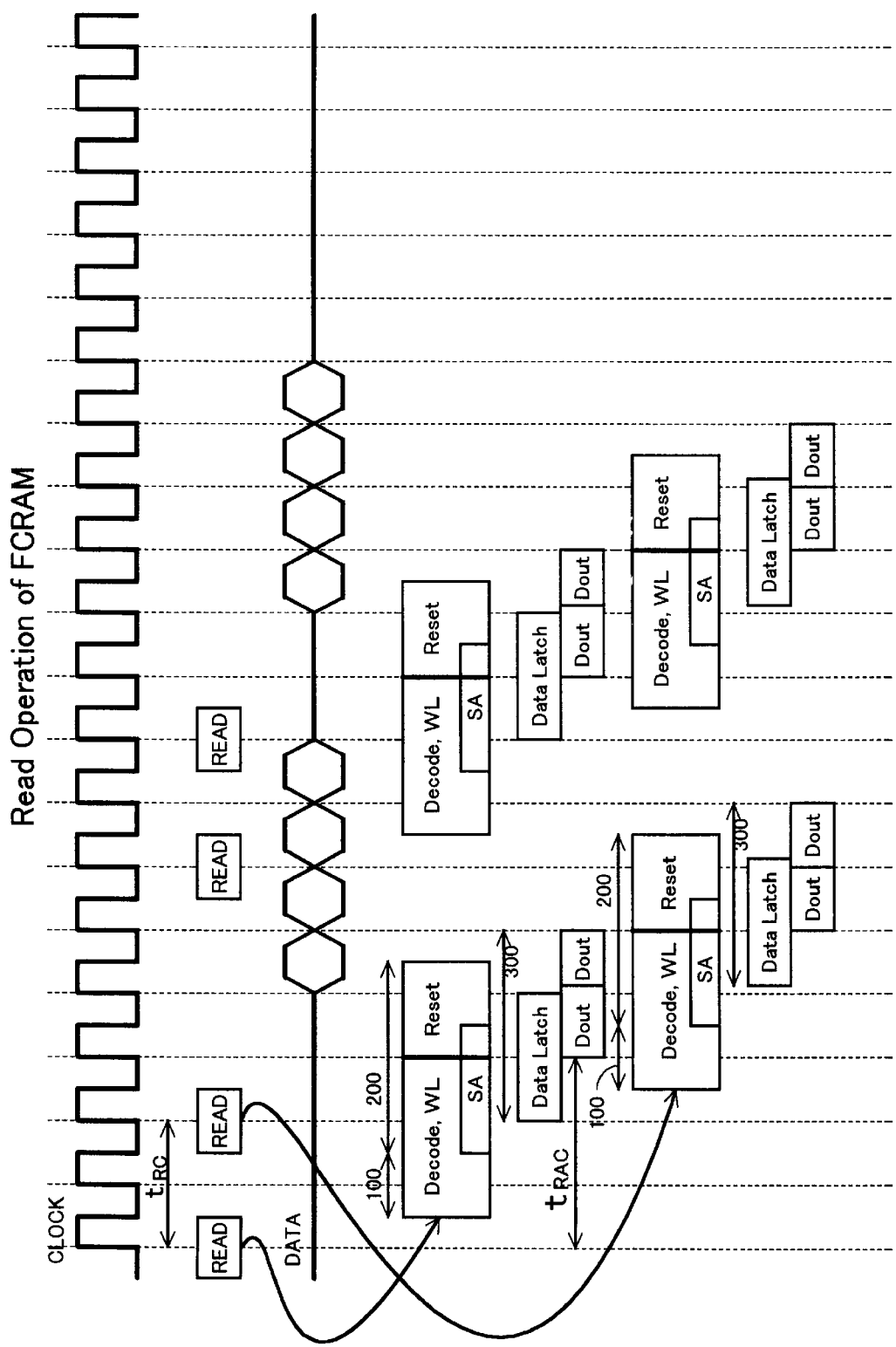
FIG. 4 is a timing chart of an FCRAM readout operation.

FIG. 4 is a timing chart of an FCRAM read operation. The characteristic features of an FCRAM are: firstly, that it operates in a pipeline configuration, being divided into a first stage for reading a row address, column address and control signals, and decoding commands, a second stage for activating and resetting word lines and sense amplifiers, and a third stage for outputting and inputting data; secondly, that the memory core thereof is divided into a plurality of sub-cell matrices, and only the sub word line and sense amplifiers in the sub-cell matrix selected by the column address are activated; and thirdly, that a plurality of data bits corresponding to the burst length are transferred simultaneously between the sense amplifiers and the third stage.

Below, a read operation is described with reference to FIG. 4. In synchronism with a read command READ, a row address Radd and column address Cadd are supplied either simultaneously or consecutively over a short time period. The first stage 100 reads these addresses and control signals, and it decodes the control signals. In accordance with the decoded results, the second stage then decodes the row address and column address, and drives (activates) a word line and drives (activates) sense amplifiers. Due to the second characteristic feature described above, the activation of the word line and sense amplifiers is conducted at high speed.

In the third stage, data amplified and latched by the sense amplifiers is output in 4-bit units via the data bus in the block to a read/write buffer 36, where the data is latched. This 4-bit data is then output in parallel to the parallel-serial converting circuit 37. The parallel-serial converting circuit 37 outputs the required number of data bits as serial data, according to the specified burst length. In the example in FIG. 4, the burst length is set to 2 and 2-bit data is output from the data output terminal DQ.

When 4-bit data is output from the read/write buffer 36 in each block to the parallel-serial converting circuit 37, which is provided commonly to all the blocks, the blocks automatically enter a reset operation (pre-charge operation). In other words, the word lines are deactivated, the sense amplifiers are deactivated and the electric potential of the bit lines and data bus lines is reset (pre-charged). This reset (pre-charge) operation is invoked by an auto-reset circuit 18. By outputting a plurality of data bits in parallel to the column-related circuit in the third stage, the activation period of the sense amplifiers can be shortened, regardless of the burst length. Therefore, as illustrated in FIG. 20 and FIG. 21, it is possible to commence the word line and sense amplifier activation operations for the subsequent read command, without having to maintain the word lines and sense amplifiers in an activated state until all the data corresponding to the burst length has been output. In other words, as shown in FIG. 4, activation of the word lines and sense amplifiers for the subsequent read command is initiated immediately after the word lines and sense amplifiers relating to the first read command have been reset.

As described above, by means of the characteristic composition of the FCRAM, the cycle time $t_{RC}$ can be made shorter than the access time $t_{RAC}$. In other words, by adopting a pipeline structure for the first, second and third stage, it is possible to initiate reading and decoding of the address and control signals for the next cycle in advance, thereby allowing the word line and sense amplifier activation time to be shortened by improvements in the memory core and simultaneous output of a plurality of bits from the memory core. Consequently, the random access operation can be carried out in a short period of time.

First Embodiment

Figure 5:
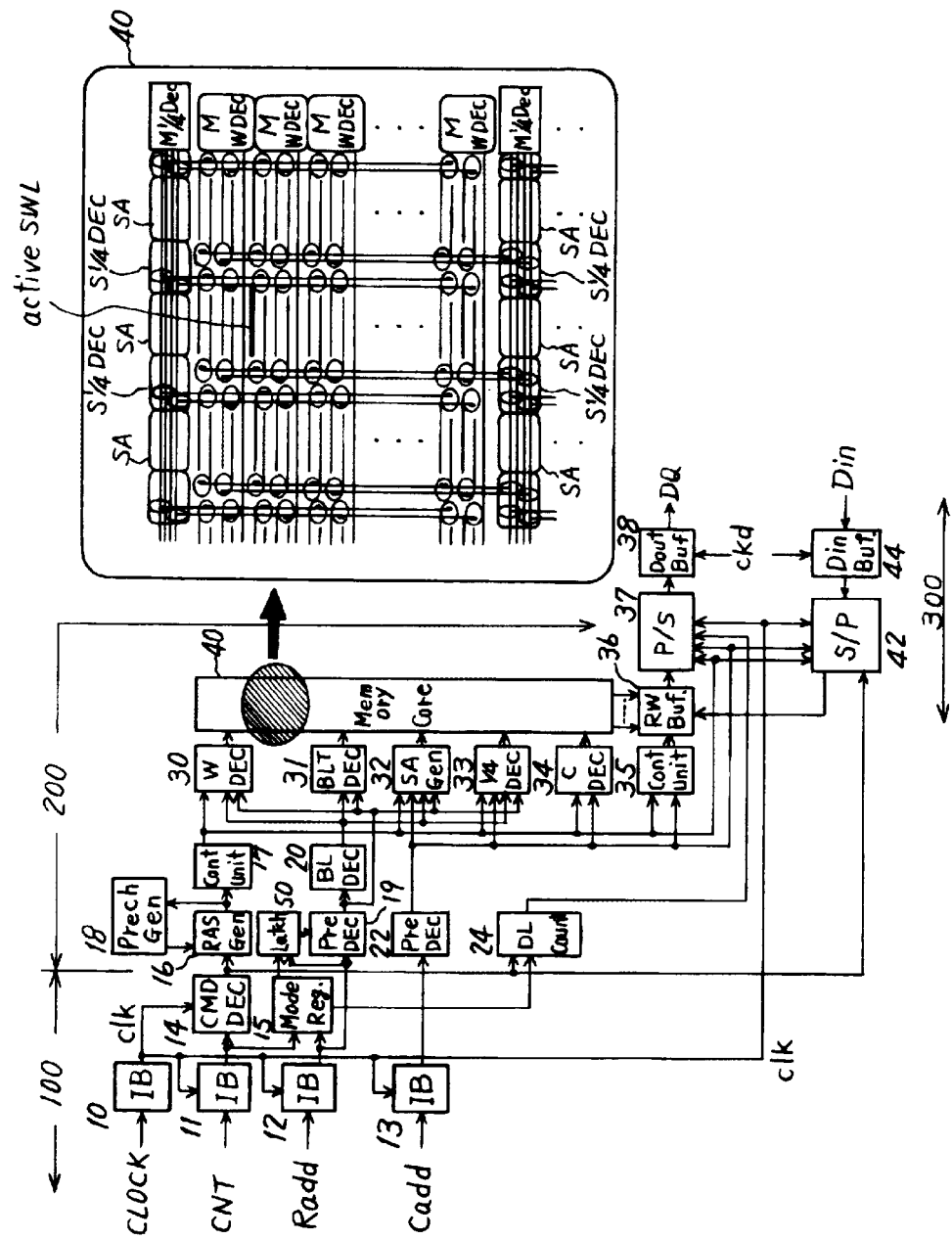
FIG. 5 is a block diagram of an FCRAM according to a first embodiment.

FIG. 5 is a block diagram of an FCRAM according to a first embodiment of the invention. The same reference numerals have been used for points which are the same as the FCRAM block diagram in FIG. 1. The point of difference of the FCRAM composition in FIG. 5 with respect to FIG. 1 is that a row address latch circuit 50 has been added for latching the row address Radd.

In the first embodiment, in addition to a standard read command, a second read command for continuing the activated state of the word lines and sense amplifiers without performing an automatic reset operation is also specified. Here, the standard read command is defined as read A and the second read command is defined as read B. When the read B command is issued, the activated state of the sense amplifiers is maintained without an automatic reset operation being performed in the second stage. After the data held by the sense amplifiers are output according to the previously issued read B command, an automatic reset operation is implemented according to a read A command supplied in a subsequent or later cycle. Thereby, it is possible to shorten the operational time required in the second stage for a read command which follows a read B command.

Figure 6:
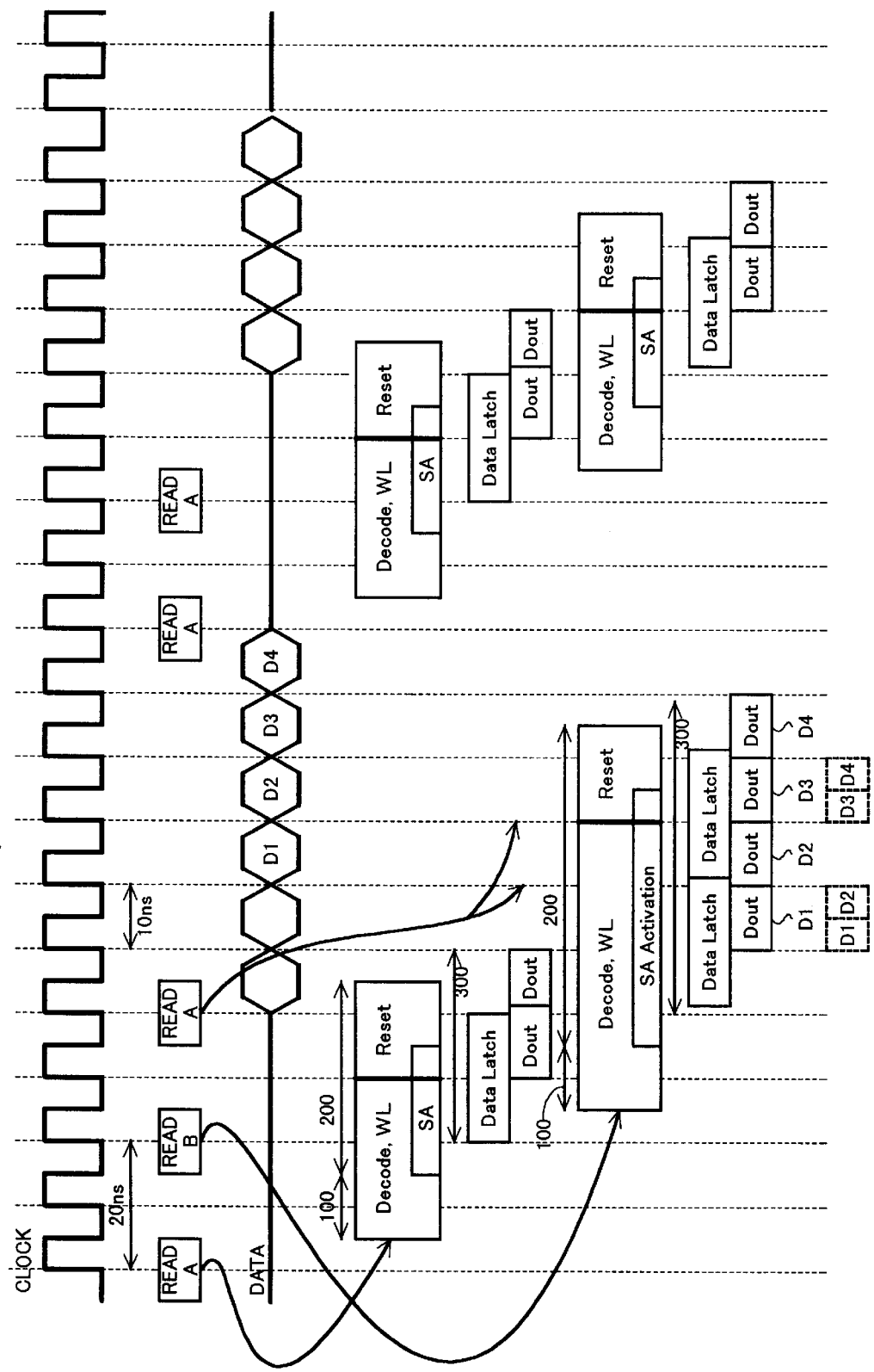
FIG. 6 is a timing chart of a readout operation according to the first embodiment.

FIG. 6 is a timing chart of a readout operation according to the first embodiment. FIG. 6 illustrates the operations implemented when a read A command READ A, read B command READ B, and then a read A command are issued. When a read A command is supplied, a standard read operation is performed. In other words, when a read A command READ A is supplied, in the first stage 100 of the pipeline composition, a row address and column address are read in, and a control signal is read in and decoded by the command decoder 14. Next, in the second stage 200, the row address and column address are pre-decoded, respectively, by a pre-decoder 19 and a pre-decoder 22. Moreover, a sub-word line is activated and corresponding sense amplifiers are activated by means of a main word decoder 30, bit line transfer gate decoder 31, sense amplifier activation circuit 32, ¼ decoder circuit 33, column decoder 24, and the like. Thereupon, in the third stage 300, 4 bits of data are output from the sense amplifier SA via a data bus to a read/write buffer 36, and then further output to a parallel-serial converting circuit 37. In the example in FIG. 6, the burst length is 2. Finally, the 2-bit data is output from a data output circuit 38. Here, automatic reset operations, such as deactivation of the word line and sense amplifiers, and pre-charging of the bit lines and data bus lines, etc., are carried out automatically in the second stage 200, immediately after the data has been transferred to the third stage.

When a read B command READ B is then supplied, the first stage performs the operations of reading a control signal and address and decoding the control signal in a similar manner to the read A command. The second stage then activates a word line and sense amplifiers and conducts data output, after which the automatic reset operation is not implemented and the word line and sense amplifiers are held in an activated state. The third stage transfers the parallel output data to the data output circuit 38, one bit at a time.

When a subsequent read A command is issued, the first stage, conducts the operations of reading the control signal and address, and decoding the control signal. The second stage then uses the same row address as that latched previously in the row address latch circuit 50. In other words, the same word line activation state and sense amplifier activation state are used as in the previous cycle. The column address Cadd supplied simultaneously with the read A command is pre-decoded and decoded, and the latch data in the sense amplifier corresponding to the select column are output in parallel and latched by the read/write buffer circuit 36. When data is output from the memory core, the second stage performs an automatic reset operation. The third stage then outputs the resulting 2-bit data, one bit at a time.

It is also possible to supply a read B command after a read B command. In this case, with the subsequent read B command also, the word line and sense amplifiers are maintained in an activated state, without performing an automatic reset operation. Consequently, a desired number of data bits can be output in a consecutive manner by repeating the read B command in accordance with the number of data bits to be output consecutively.

As described above, in the case of a read A command, the cycle time tRC for a random access operation can be shortened by means of the second stage performing an automatic reset operation. However, in the case of a read B command, the second stage does not implement an automatic reset operation. Therefore, in the subsequent read command, a column access mode is assumed whereby data on the same word line is output from the sense amplifiers as a plurality of parallel data bits. In column access mode, the second stage does not perform a new word line and sense amplifier activating operation, and a plurality of data bits from the data bits stored in the sense amplifiers activated in the previous cycle are output in parallel to the read/write buffer circuit 36. Therefore, it can be seen that the operating time of the second stage will be shortened.

Here, the difference between the first embodiment and the operation in conventional page mode and burst mode (FIGS. 20, 21) described above will be explained. In conventional page mode and burst mode, the data stored in sense amplifiers is selected according to the column address supplied in the subsequent cycle and transferred to an output circuit in 1-bit units. By contrast, in the first embodiment, at the read command after a read B command, the data stored in the sense amplifiers is selected according to the column address supplied in the subsequent cycle, and transferred to an output circuit in parallel, in units of a plurality of bits corresponding to the burst length. In other words, the aforementioned column access mode is adopted. Therefore, data output by a read command following a read B command can be conducted at high speed. Moreover, the cycle time for a random access operation at a read A command following a read B command can be shortened.

Figure 18:
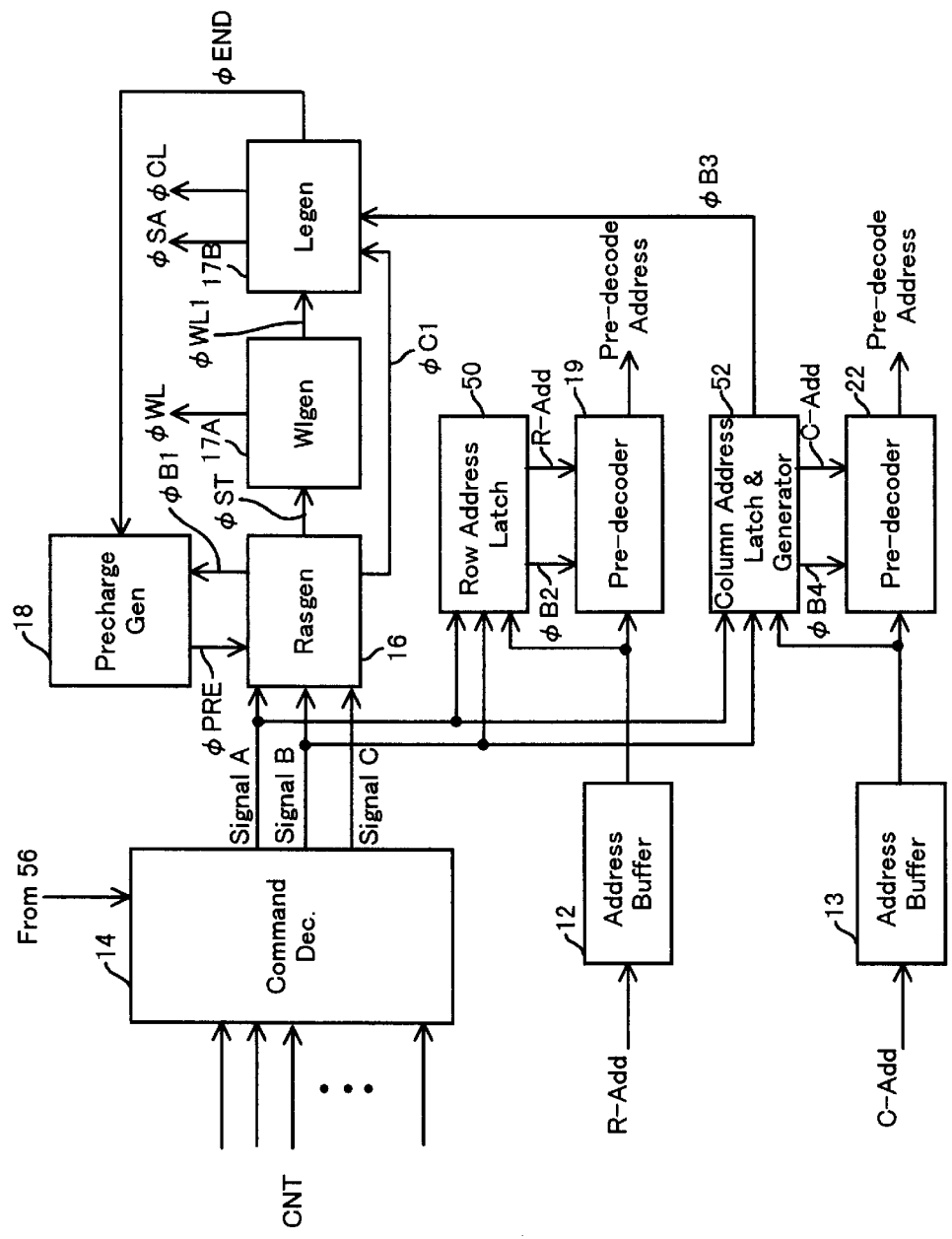
FIG. 18 is a compositional diagram of a timing control circuit group.
Figure 19:
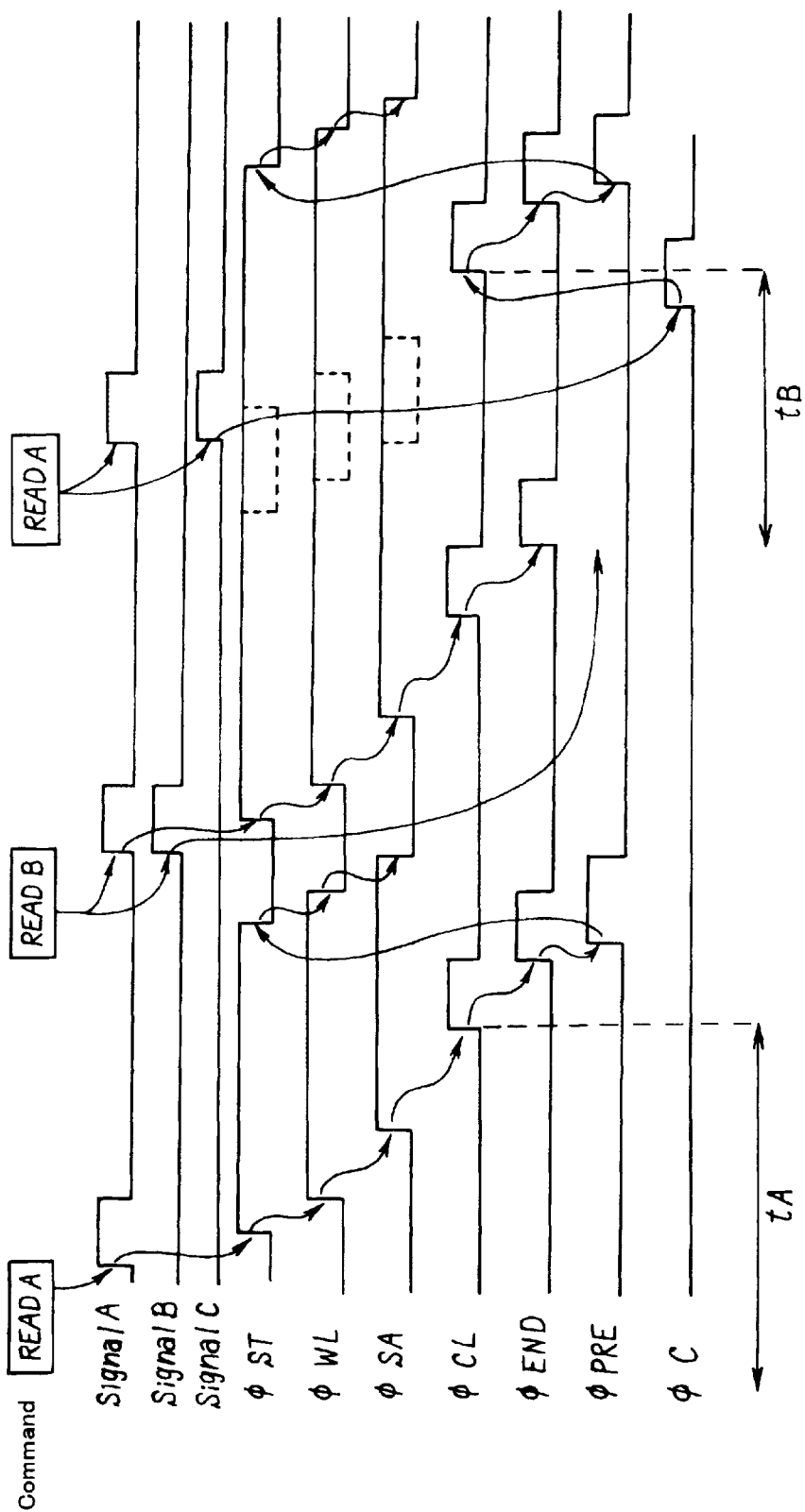
FIG. 19 is an operational timing chart of a timing control circuit group for implementing the operation in FIG. 6.

FIG. 18 is a compositional diagram of a timing control circuit group in the present embodiment, and FIG. 19 is a timing chart of the operation of the timing control circuit group when performing the operation in FIG. 6. The reference numerals for the circuits in FIG. 5 have been used for corresponding circuits in the timing control circuit group in FIG. 18. In FIG. 18, the WL generator 17A and CL generator 17B are internal circuits of the control unit 17 in FIG. 5.

A control signal CNT is supplied externally to a command decoder 14. If a read A command as described above is supplied as a control signal CNT, then signal A is activated by the command decoder 14. If a read B command as described above is supplied, then signal B is also activated by the command decoder in addition to signal A. Moreover, signal C is activated by the read command supplied after the read B command, and if the read command following the read B command is a read A command, then signal A is also activated, whilst if the read command is a read B command, then signals A and B are also activated.

The operation of a RAS generator 16, row address latch circuit 50, and the like, are controlled by means of the internal signals A, B, C generated by the aforementioned command decoder 14, and the above operation implemented when commands are supplied in the order read A, read B, read A is conducted accordingly.

The operations implemented when commands are supplied in the order read A, read B, read A are now described with reference to the timing chart in FIG. 19. When a read A command is supplied initially, the command decoder 14 activates signal A. In response to the activation of signal A, RAS generator 16 sets the memory core operation start signal φST to level H at a prescribed timing. In response to the core operation start signal φST, WL generator 17A sets the word line activation signal φWL to level H at a prescribed timing. The word line activation signal φWL is supplied, for example, to the main word decoder 30, and controls the timing at which the word line WL is activated.

The WL generator 17A supplies a control signal φWL1 to LE generator 17B at a prescribed timing. In response to this control signal φWL1, the LE generator 17B sets the sense amplifier activation signal φSA controlling the activation of the sense amplifiers to level H at a prescribed timing. This sense amplifier activation signal φSA is supplied, for example, to a sense amplifier activating circuit 32, and controls the timing at which the sense amplifiers are activated.

The LE generator 17B sets the column gate control signal φCL to level H in synchronism with the activation of the sense amplifiers, thereby controlling the timing at which the column gate connecting the sense amplifiers to the data bus is opened. As shown in FIG. 19, the column gate control signal φCL is a fixed pulse width signal, which is supplied to the column decoder 34, for example.

In an FCRAM where the present embodiment is applied, when data in the second stage incorporating the memory core is supplied via a data bus to the parallel-serial converting circuit 37, the memory core automatically enters a pre-charge operation. For this purpose, after the LE generator 17B generates a column gate control signal φCL, the memory core operation end signal φ END is set to level H and supplied to a precharge generator 18. In response to this, the precharge generator 18 sets the precharge control signal φPRE to level H which is supplied to the RAS generator 16.

In response to this precharge control signal φPRE, the RAS generator 16 sets a core operation start signal φ ST to level L and controls the memory core such that it commences a precharge operation. Accordingly, the WL generator 17A sets the word line activation signal φWL to level L, thereby placing the word lines in a deactivated state. Thereupon, the LE generator 17B sets the sense amplifier activation signal φSA to level L, thereby initiating a precharge operation in the sense amplifiers. The foregoing is an auto-precharge operation.

Next, a read B command is supplied. In response to this read B command, the command decoder 14 activates both signals A and B. In response to signal A, the RAS generator 16, WL generator 17A and LE generator 17B generate a core operation start signal φST, word line activation signal φWL, sense amplifier activation signal φSA, and column gate activation signal φCL and end signal φEND, similarly to a case where a read A command is issued.

In response to signal B, the RAS generator 16 also supplies a control signal φB1 to a precharge generator 18. Upon receiving this control signal φB1, the precharge generator 18 prohibits generation of the precharge control signal φPRE, which is produced in response to the end signal φEND. Therefore, the auto-precharge operation implemented in the case of a read A command is not carried out. In other words, the auto-precharge operation illustrated by the broken line in FIG. 19 is not implemented.

Moreover, in response to signal B, the row address latch circuit 50 latches the row address R-add. The row address latch circuit 50 then supplies a control signal φB2 to the pre-decoder 19, in response to signal B, so as to instruct the predecoder 19 to validate the row address from the row address latch circuit 50. Since the aforementioned auto-precharge operation has been prohibited, the activation of the word line and sense amplifiers in the memory core is maintained in an unchanged state.

Next, a read A command is supplied. Since this read command follows a read B command, the command decoder 14 activates signal C. Moreover, the command decoder 14 also activates signal A in response to this read A command. In this command cycle, the state of the row circuits remains unchanged, and the word line activation and sense amplifier activation are maintained in the same state as in the previous command cycle. Therefore, the RAS generator 16 supplies the control signal φ C1 to the LE generator 17B at a prescribed timing, without generating a core operation start signal φST.

In response to this control signal φC1, the LE generator 17B generates a column gate activation signal φCL, at an earlier timing than normal. Therefore, of the data in the sense amplifires in an activated state, the data corresponding to the column address supplied at the same time as the read A command is output to the read/write buffer 36. This data is then output serially in synchronism with a clock via the parallel-serial converting circuit 37 in the third stage to the output terminal DQ.

When the LE generator 17B generates an end signal φ END, the precharge generator 18 sets the precharge control signal φPRE to level H. In the case of a read A command, since signal B is not activated, the control signal φB1 is not activated either and the precharge generator 18 generates precharge control signal φPRE. In response to this precharge control signal φPRE, the aforementioned auto-precharge operation is implemented.

As described above, at a read A command following a read B command, it is possible to read out data specified by a column address, without having to activate a word line and sense amplifiers, as in conventional page mode operation. Therefore, as illustrated in FIG. 19, for a read A command following a read B command, the time period tB from supply of the command until generation of the column gate control signal φCL becomes shorter than the corresponding time period tA for a standard read A command.

If a further read B command is supplied instead of a subsequent read A command, then signals A, B, C are all activated. In this case, the column gate control signal φCL is generated by control signal φC1 and high-speed readout in page mode is conducted, without a word line and sense amplifier activation operation according to the signal φC. Moreover control signal φ B1 is generated by signal B, thereby prohibiting generation of the precharge control signal φPRE by the precharge generator 18. Consequently, the activated state of the word line and sense amplifiers is maintained until the next command cycle, without performing an auto-precharge operation. In this way, page mode operation can be repeated as long as read B commands continue to be issued.

In the examples in FIGS. 4 and 6, read commands are supplied at a frequency of 2 cycles of a CLOCK having a frequency of 10 ns, for example. This two clock cycle, or 20 ns time period, is the cycle time required for the second stage to activate and then auto-reset the word lines and sense amplifiers. In the example in FIG. 6, data output is conducted at intervals of 1 clock cycle (10 ns). However, if the data output is performed at intervals of one half of this cycle (5 ns), then as illustrated by the broken line in FIG. 6, data D1, D2 are output in the initial 10 ns period, and then 10 ns later, data D3, D4 are output. Therefore, there is a data output interval of 10 ns between the output of data D1, D2 and data D3, D4.

However, by using the read B command described above, in the read command of the next cycle, column access mode is assumed, whereby the operation of reading out data from a memory cell to a sense amplifier by activating a word line and sense amplifier is omitted, and therefore the read command for the next cycle can be supplied after a time shorter then 20 ns, for example, 10 ns. In other words, by outputting data corresponding to the burst length from the memory core 40 in parallel, the frequency of data transfer between the sense amplifiers and the input and output circuits 36, 37 is reduced by a factor of 1/burst length. Accordingly, by reducing the clock cycle for data output to 1/burst length, it is possible to speed up data output by a factor of 1×burst length.

Figure 7:
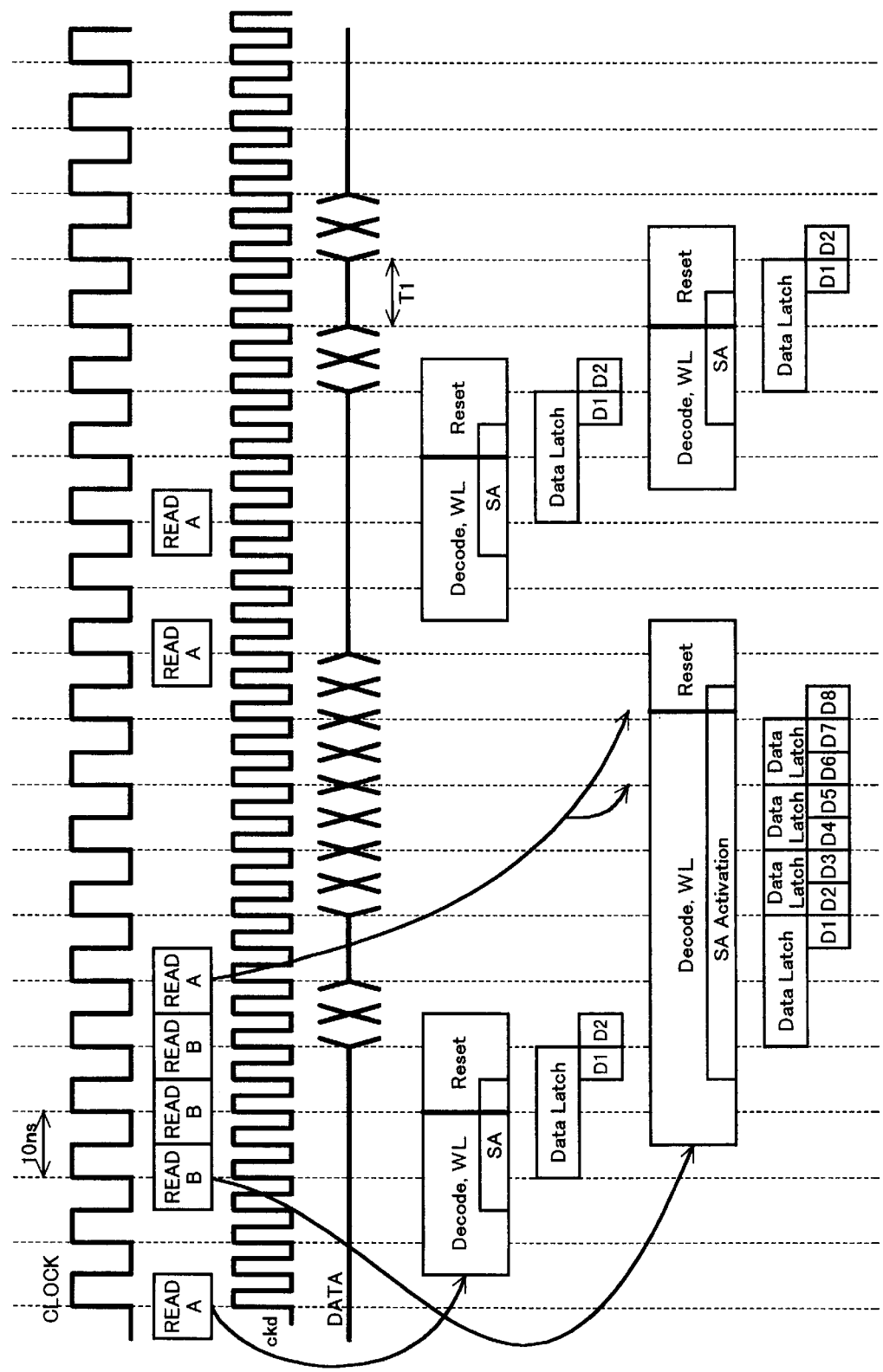
FIG. 7 is a timing chart of an operation for reading out high-speed data output according to the first embodiment.

FIG. 7 is a timing chart of an operation for reading out high-speed data output according to the first embodiment of the invention. In this example, the burst length is 2. Whilst the external clock, CLOCK, has a cycle of 10 ns, similarly to the case illustrated in FIG. 6, the data output clock ckd is set to this cycle ×1/burst length, or ½,=5 ns cycle. Consequently, the output rate from the data output circuit 38 is twice that in FIG. 6.

In FIG. 7, after a read A command, a read B command, read B command, read B command and then a read A command are supplied consecutively at 10 ns intervals, 2 bits of data being output respectively for each command, making a total of 8 data bits D1–D8 output in a time period of 40 ns. In response to a read B command, the second stage latches the row address, without performing an auto-reset operation, and the activated state of the word line and sense amplifiers is maintained. Therefore, when the two subsequent read B commands and the final read A command are received, the second stage transfers the data in the sense amplifiers selected according to the column address in a consecutive fashion, without having to drive the word line or activate the sense amplifiers. The third stage then converts the transferred data from parallel to serial data, and outputs the data D1–D8 at high speed via the data output circuit 38, in response to the data clock ckd. Therefore, in the example in FIG. 7, data is output at twice the speed of the operation in FIG. 6.

When data D7, D8 are output in response to the final read A command, the second stage performs an automatic reset operation.

If the burst length is set to 4, then the data output clock ckd can be set to ¼ of the cycle of the external CLOCK. When the burst length is 4, data transfer from the sense amplifiers SA in the memory core 40 to the read/write buffer circuit 36 and the parallel-serial circuit 37 is conducted in parallel in 4-bit units. Therefore, this 4-bit data can be output at high speed according to the data output clock ckd operating at ¼ of the cycle of the external CLOCK.

If the cycle of the data output clock ckd is shortened as described above, then when a read A command is received consecutively, on the right-hand side of the chart in FIG. 7, although an interval indicated by time period T1 occurs between the output data, the operation of the second stage at a further subsequent read command can be shortened by using a read B command, and hence the interval such as T1 between the output data can be eliminated and data can be output more rapidly.

Figure 8:
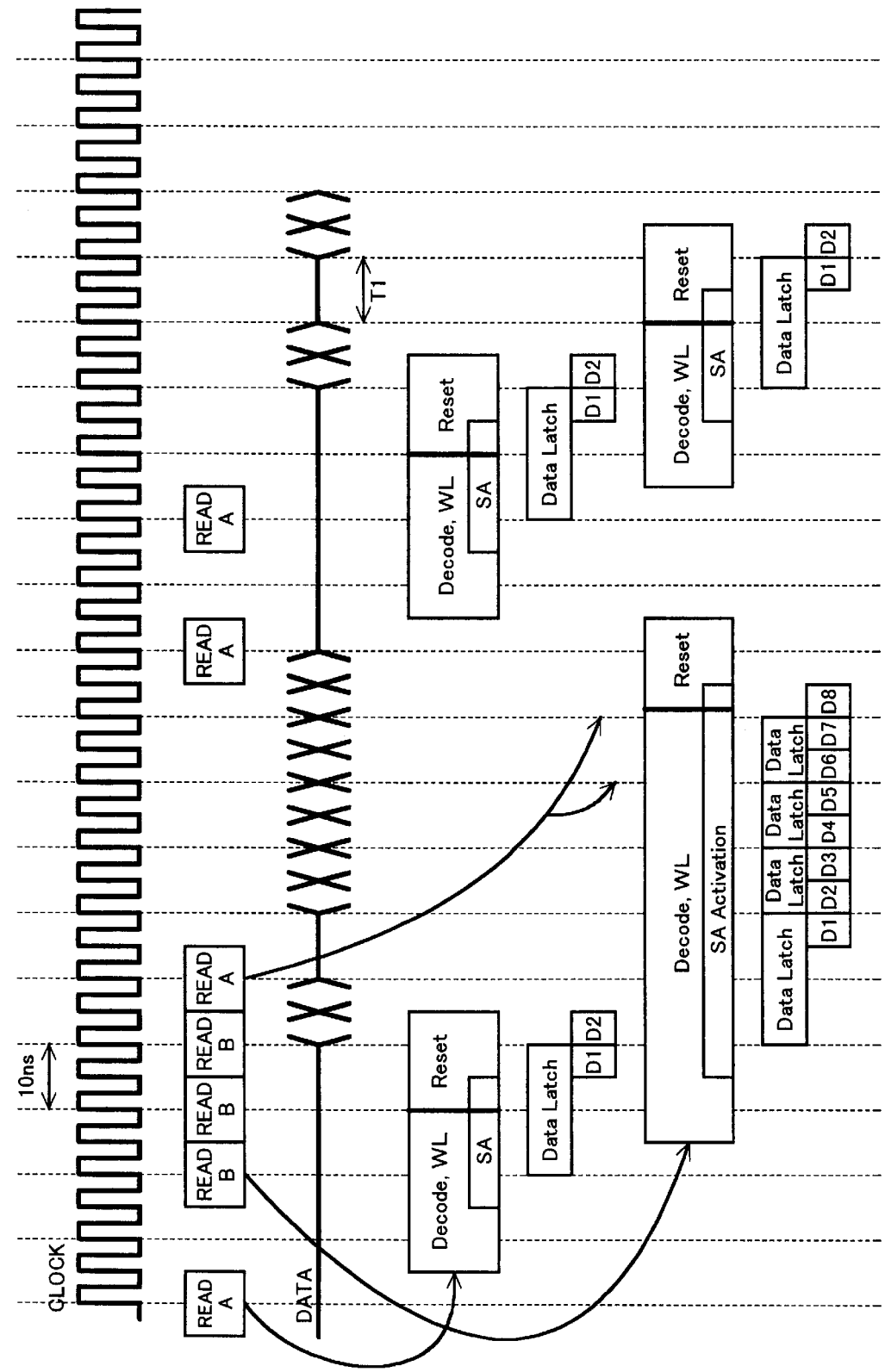
FIG. 8 is a timing chart of a further operation for reading out high-speed data output according to the first embodiment.

FIG. 8 is a timing chart of an operation for reading out high-speed data output according to the first embodiment. In this example also, the burst length is 2. Here, the external clock, CLOCK, is set to 1/burst length (½)× the cycle in FIG. 6=5 ns. Similarly to the example in FIG. 7, a read B command, read B command and a read A command are supplied, followed by a read B command. In case also, a read command following a read B command can be supplied at an interval of 10 ns, thereby shortening the cycle time.

In the example in FIG. 8, the cycle of the external CLOCK is shorter than in the example in FIG. 7. Therefore, in FIG. 8, the setup time and hold time for addresses and data supplied in synchronism with the clock can be shortened, and hence the load on the memory controller can be reduced. On the other hand, in the example in FIG. 7, the external CLOCK cycle is long, and hence the setup time and hold time are long, so the load on the memory device can be reduced.

Figure 9:
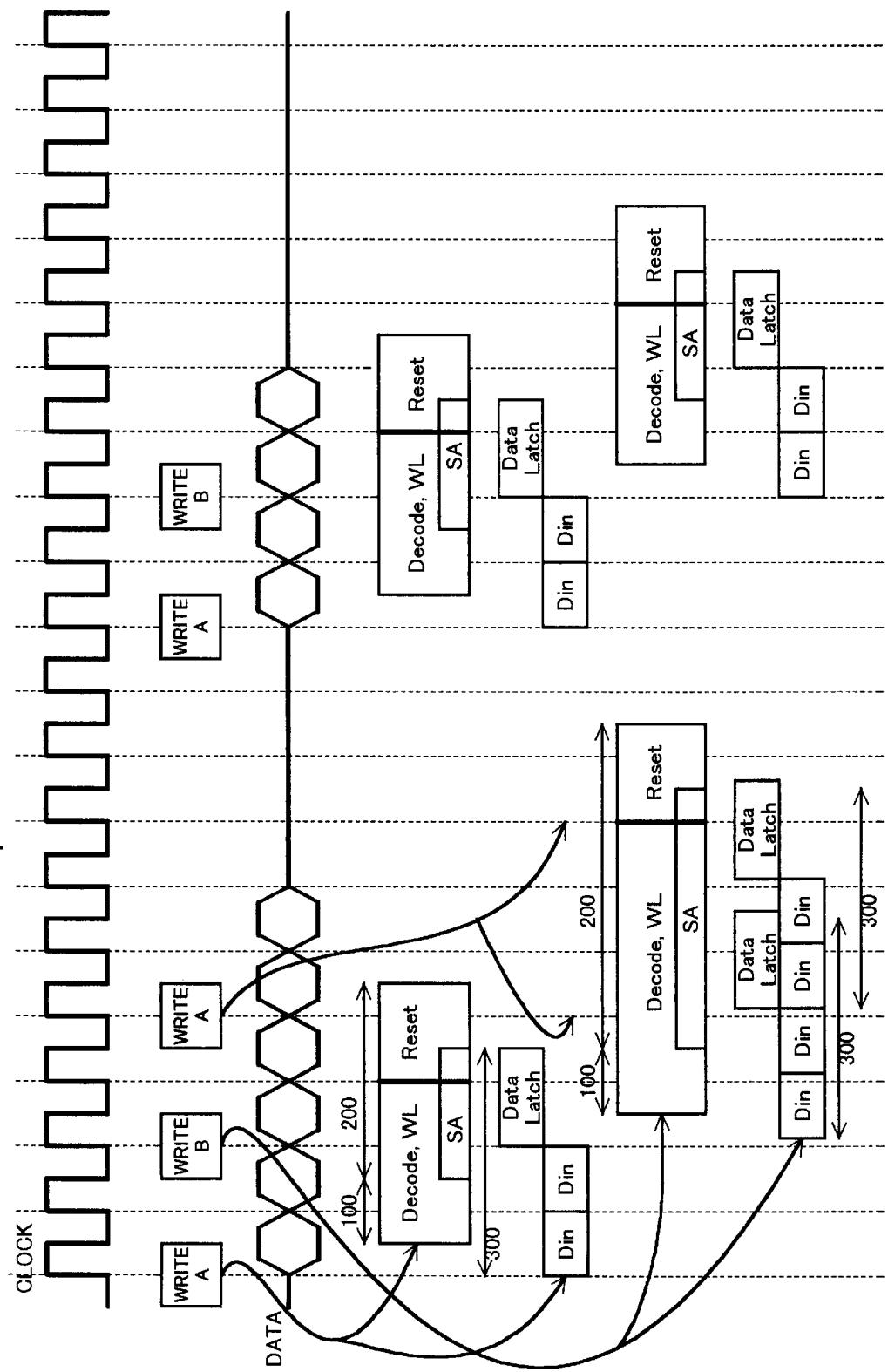
FIG. 9 is a timing chart of a write operation according to the first embodiment.

FIG. 9 is a timing chart of a write operation according to the first embodiment. Similarly to the readout operation described above, in this example, in addition to the write command for implementing a standard write operation, a second write command is specified whereby the auto-reset (or auto-precharge) operation implemented by the second stage after the write operation is not conducted. A write command for implementing a standard write operation is defined as a write A command, and the second write command is defined as a write B command. FIG. 9 shows an example where the burst length is set to 2.

In the example in FIG. 9, firstly, a write A command for implementing a standard write operation is supplied. When this command is issued, the third stage 300 first inputs the data corresponding to the burst length in the data input circuit 44, serially. When these two data bits have been latched by the read/write buffer circuit 36, they are then transferred in parallel to a sense amplifier which has been activated previously. Before the second stage 200 is operated, the first stage 100 reads in a control signal and address and completes command decoding. The second stage 200 then decodes the address, activates a word line and activates a sense amplifier. In other words, in this state, preparations have been completed for rewriting to a memory cell which has not yet been written to. Thereupon, the two bits of input data are transferred in parallel from the serial-parallel converting circuit 42 to the read/write buffer circuit 36, and the data is then transferred to the sense amplifiers.

The two bits of input data are written simultaneously from the read/write buffer circuit 36 to the activated sense amplifiers, according to the selected column address. After the two bits of input data have been transferred to the memory core 40, the second stage 200 automatically deactivates the word line, deactivates the sense amplifiers, and performs a pre-charge operation.

Since the row circuitry of the FCRAM has a pipeline structure comprising a first and a second stage, the memory core is divided into sub-cell matrices in such a manner that word lines and sense amplifiers can be activated at high speed, and a plurality of data bits can be transferred to sense amplifiers in parallel, and moreover, since an automatic reset function is provided, the write cycle time in a random access operation is shortened.

In the first embodiment, a new write command WRITE B is defined and when a write B command is issued, the second stage does not perform an automatic reset operation. Therefore, the word line and sense amplifier are maintained in an activated state. As illustrated in FIG. 9, at a write A command supplied following a write B command, data is written to memory cells on the same word line. Since the activated state of the word line and sense amplifiers is maintained by a write B command, the step of activating the word line and sense amplifiers in the second stage can be omitted, and hence a plurality of input data bits can be transferred from the third stage 300 to the sense amplifiers in a short period of time after the write command has been issued. In specific terms, it is possible to transfer a plurality of input data bits to a sense amplifier once the column address Cadd has been decoded.

Similarly to a readout operation, according to the present embodiment, in the column access operation invoked by a write command following a write B command, a plurality of input data bits corresponding to the burst length are transferred in parallel to sense amplifiers in the memory core 40. On this point, this operation differs from a write operation in conventional page mode or burst mode.

At a write B command, the row address latch circuit 50 illustrated in FIG. 5 latches the row address, and when a subsequent write command is issued, this latched row address is supplied to the row pre-decoder 19. When a write B command is detected, the auto-reset circuit 18 does not implement an automatic precharge operation.

Figure 10:
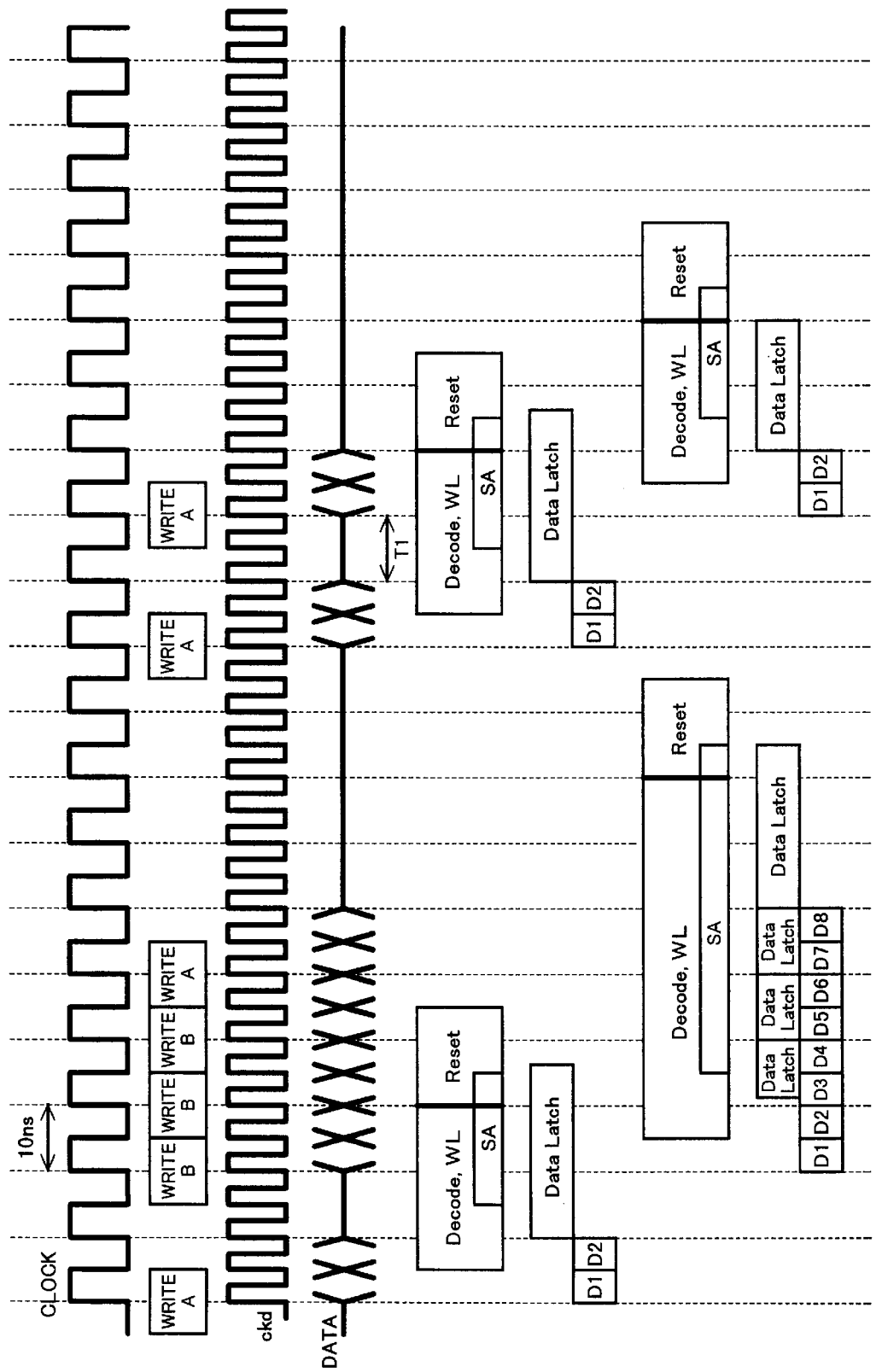
FIG. 10 is a timing chart of an operation for writing high-speed data input according to the first embodiment.

FIG. 10 is a timing chart of an operation for writing high-speed data input according to the first embodiment of the invention. In this example, a data input clock ckd is set to a cycle of 1/burst length=½ of the 10 ns cycle of an external clock, CLOCK. Consequently, by using a write B command, it is possible to eliminate the interval T1 between input data generated when standard write commands, write A, are supplied consecutively. Since the FCRAM is able to transfer data bits corresponding to the burst length into the memory core 40 simultaneously, it is possible to input and write data at high speed by using the aforementioned high-speed data input clock ckd.

Following a write B command, three write commands, write B, write B and write A, are supplied consecutively at intervals equal to the 10 ns cycle of the external clock, CLOCK. In the respective write cycle following a write B command, write data corresponding to the burst length is transferred to the sense amplifiers activated in the previous cycle, without the second stage 200 performing a new word line or sense amplifier activating operation, and when an automatic reset is implemented in response to the final write A command, the data held in the sense amplifiers is written to the corresponding memory cells.

Figure 11:
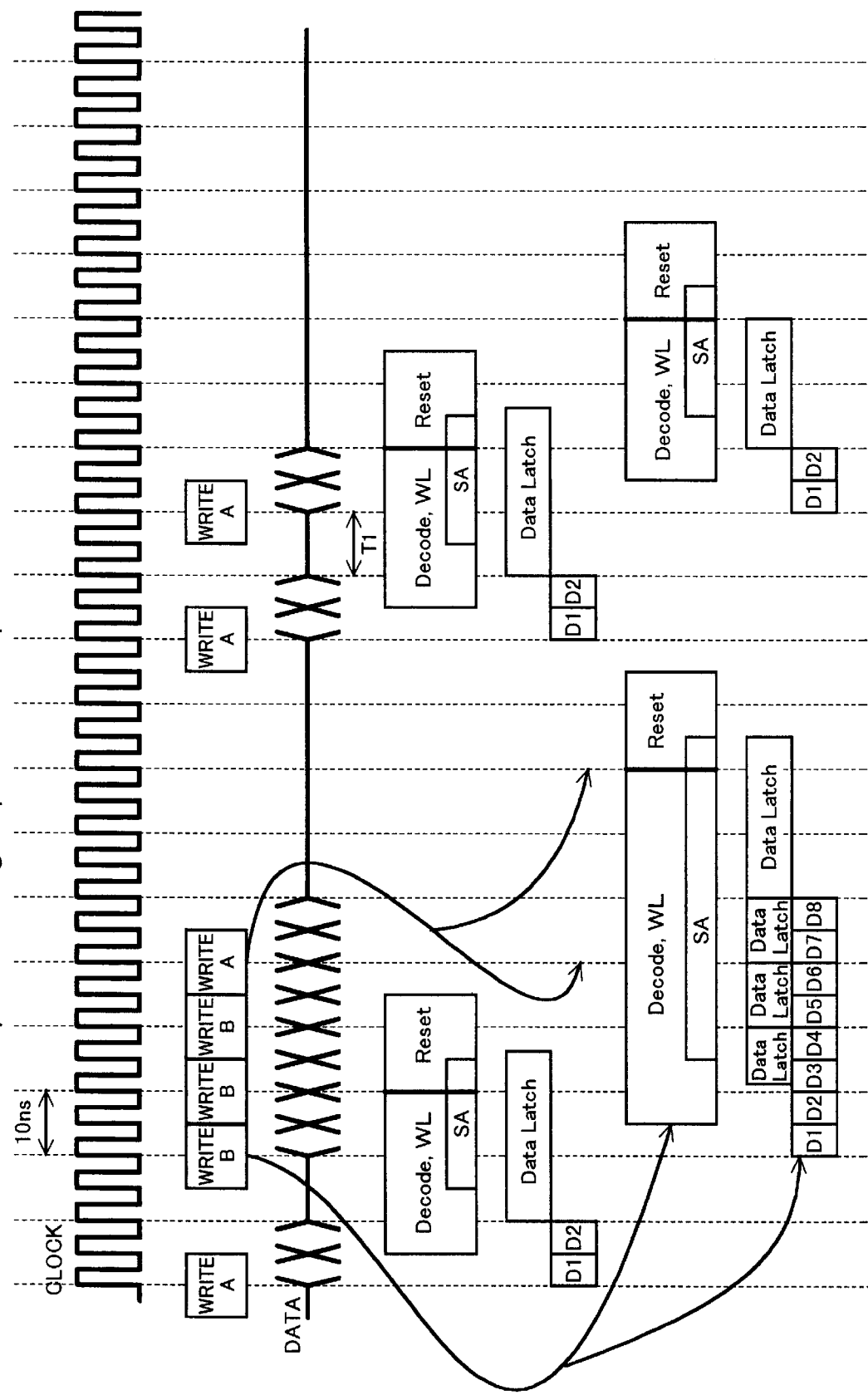
FIG. 11 is a timing chart of a further operation for writing high-speed data input according to the first embodiment.

FIG. 11 is a timing chart of a further operation for writing high-speed data input according to the first embodiment. This example differs from that in FIG. 10 in that the external clock, CLOCK, has a cycle of 1/burst length (=½)×the CLOCK cycle in FIG. 10. Apart from this point, it is the same as FIG. 10. When the external clock, CLOCK, is speeded up in this manner, the setup time and hold time for the input data and address are shortened, and the load on the memory controller is reduced, but the load on the memory device is increased. In the case of FIG. 11, by using a write B command, write data can be transferred to the memory core at high speed by a following write command, without the second stage 200 implementing an automatic reset operation. Therefore, it is possible to eliminate the time period T1 arising between input data when standard write commands, write A, are supplied consecutively.

Second Embodiment

In the second embodiment, a burst read command and a burst stop command are defined, in addition to read commands for implementing standard readout operations. At a burst read command, the second stage transfers data in a continuous fashion from the sense amplifiers in the memory core to the third stage, at each clock interval corresponding to the burst length, whilst maintaining word line and sense amplifier activation in an unchanged state. Thereupon, when a burst stop command is supplied, once the data has been transferred from the memory core to the third stage, the second stage performs an automatic reset, and enters standby for the next operation. Accordingly, the column address is incremented internally, in response to the burst read command, and then supplied to the pre-decoder.

Moreover, in addition to write commands for implementing standard write operations, a burst write command and burst stop command are also defined. In this case, similarly, at a burst write command, the second stage maintains the activated state of the word line and sense amplifiers and data is transferred in a continuous fashion from the third stage to the memory core, at each clock interval corresponding to the burst length. Thereupon, when a burst stop command is supplied, once data has been transferred from the third stage to the memory core, the second stage implements an automatic reset operation and writing of data corresponding to the burst length is completed.

Figure 12:
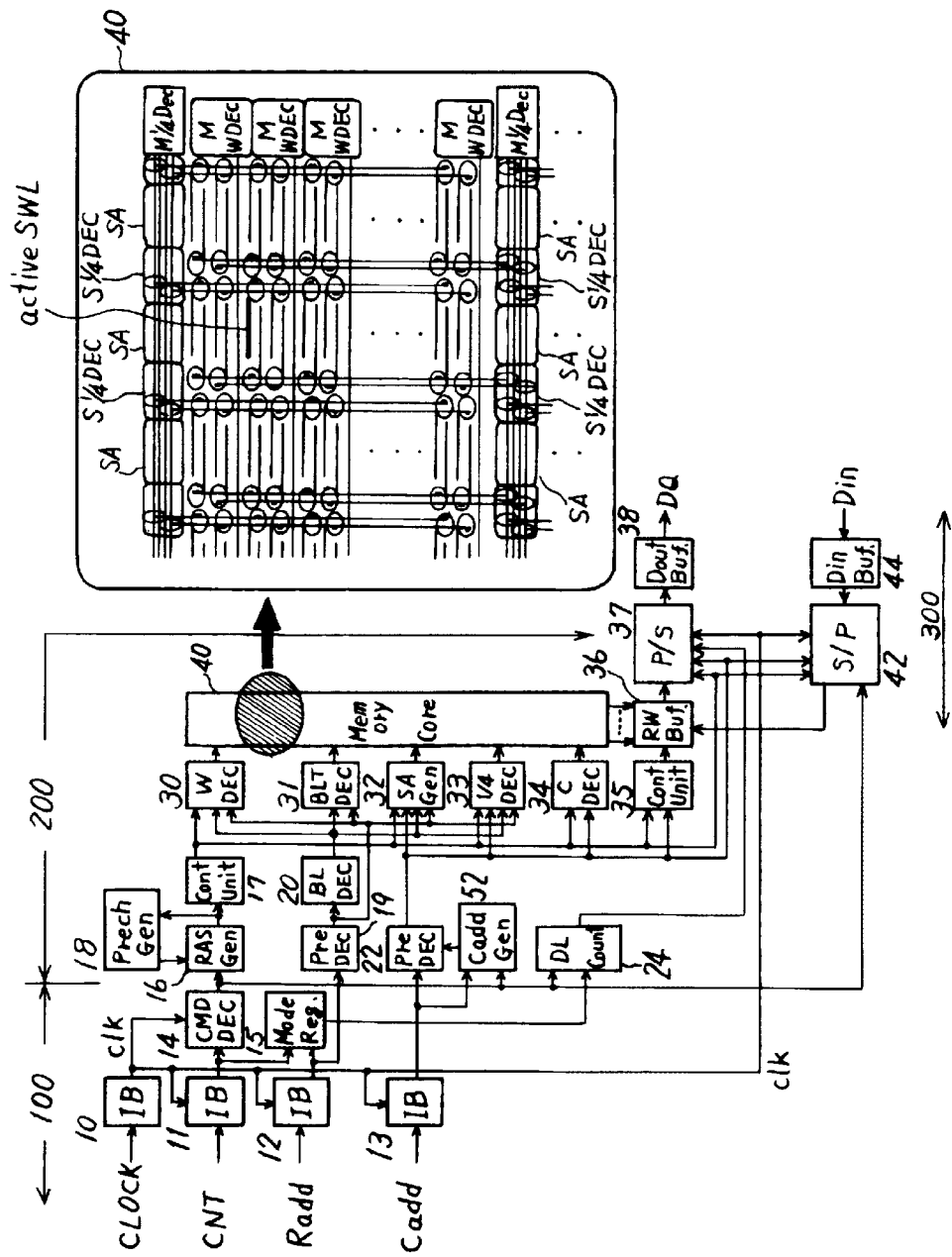
FIG. 12 is a block diagram of an FCRAM according to a second embodiment.

FIG. 12 is a block diagram of an FCRAM according to a second embodiment of the invention. In FIG. 12, the same reference numerals have been used for elements which are the same as those in FIG. 1. In the block diagram in FIG. 12, a column address generating circuit 52 for incrementing the column address internally and supplying same to the pre-decoder 22, when a burst read or burst write command has been supplied, is appended to the composition illustrated in FIG. 1. Moreover, the automatic reset circuit 18 does not perform an automatic reset (pre-charge) operation, when a burst read or burst write command is issued. However, the automatic reset circuit 18 performs an automatic reset operation when a subsequent burst stop command is received.

Figure 13:
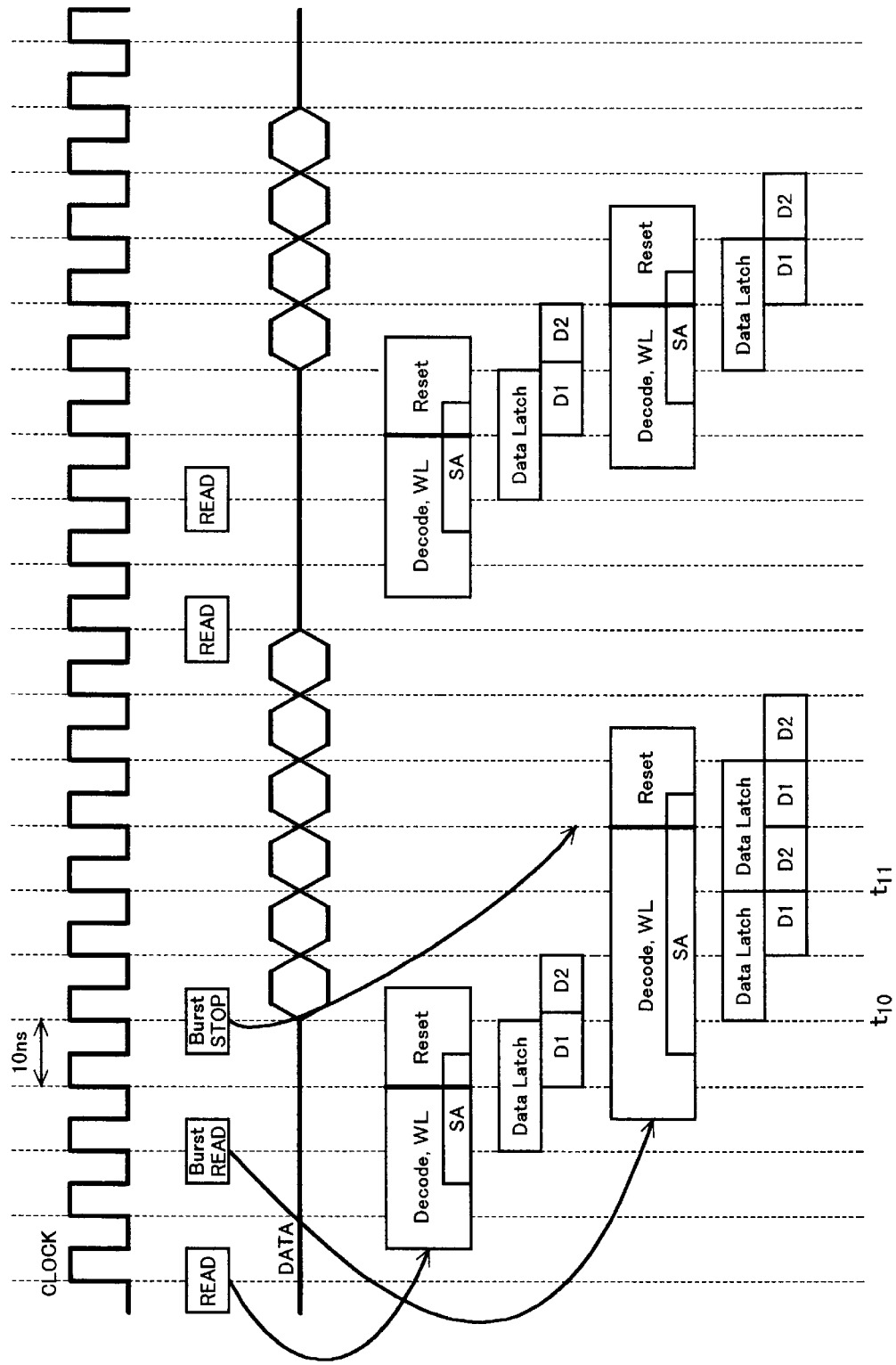
FIG. 13 is a timing chart of a readout operation according to the second embodiment.

FIG. 13 is a timing chart of a readout operation according to the second embodiment. In this example also, the burst length is 2. The standard readout operation corresponding to a READ command is the same as that illustrated in FIG. 4. However, when a BurstREAD command is supplied, firstly, a sense amplifier is selected according to the supplied column address, and then readout data is transferred to the third stage. At timing t11, two clocks of the burst length after timing t10 when the first data bit is transferred, a further 2 bits of readout data are transferred. Here, the data held in the sense amplifiers is selected according to a column address generated by the internal column address generating circuit 52, by incrementing the initial column address. Therefore, in response to a burst read command, the automatic reset circuit 18 in the second stage 200 maintains the activated state of the sense amplifiers, without performing an automatic reset operation.

As described above, when a burst read command has been supplied, column addresses are generated automatically inside the device, whilst the word lines and sense amplifiers remain activated, and a plurality of data bits corresponding to the burst length selected according to the generated addresses are transferred in parallel from the sense amplifiers to the read/write buffer circuit 36. This transfer of plural data bits continues until a burst stop command BurstSTOP is issued and data transfer from the memory core to the third stage 300 has been completed. Moreover, the transfer rate is equal to the burst length×the frequency of the control clock in the data output circuit. In the example in FIG. 13, the data transfer cycle is 2 clocks (20 ns). When a burst stop command is issued, the automatic reset circuit 18 deactivates the word line and sense amplifiers, and conducts a precharge operation. Thereby, the incrementing operation in the column address generating circuit 52 is halted.

In the readout operation according to the second embodiment, when a burst read command has been supplied, data on the same word line is transferred successively from sense amplifiers to the third stage, by using internally generated column addresses. In the second embodiment, when a burst read command is supplied, it is not necessary to operate the first stage or to perform word line and sense amplifier activation in the second stage, and hence data can be read out at a faster rate. Although not illustrated, high-speed readout can be conducted by shortening the data clock cycle, as demonstrated in FIGS. 7 and 8.

The operations implemented by the burst read command and burst stop command in the second embodiment are controlled by the timing control circuit group illustrated in FIG. 18, as described in relation to the first embodiment. In other words, in response to a burst read command, the command decoder 14 activates signals A, B. In response to signal A, a standard word line and sense amplifier activation operation is carried out, and data readout is implemented according to a column control signal φCL. At the same time, in response to signal B, the column address latching and generating circuit 52 latches the column address. Thereupon, the column address generating circuit 52 increments the latched column address and supplies this incremented column address C-add, along with a control signal φB4, to the pre-decoder 11. Each time the column address is incremented, an increment signal φB3 is supplied to the LE generator 17B, invoking generation of a column gate control signal φCL. Thereby, a burst mode operation is implemented whereby data is output successively from the sense amplifier.

In the burst operation described above, the control signal φB1 generated in response to the signal B prohibits generation of the precharge control signal φPRE by the precharge generator 18, hence maintaining the activated state of the word line and sense amplifiers.

Finally, when a burst stop command is issued, the command decoder deactivates signal B, whilst maintaining signal A in an activated state. Thereby, when data readout from the activated sense amplifier has been completed, a precharge signal φPRE is generated by the precharge generator 18, and an auto-precharge operation is carried out.

Figure 14:
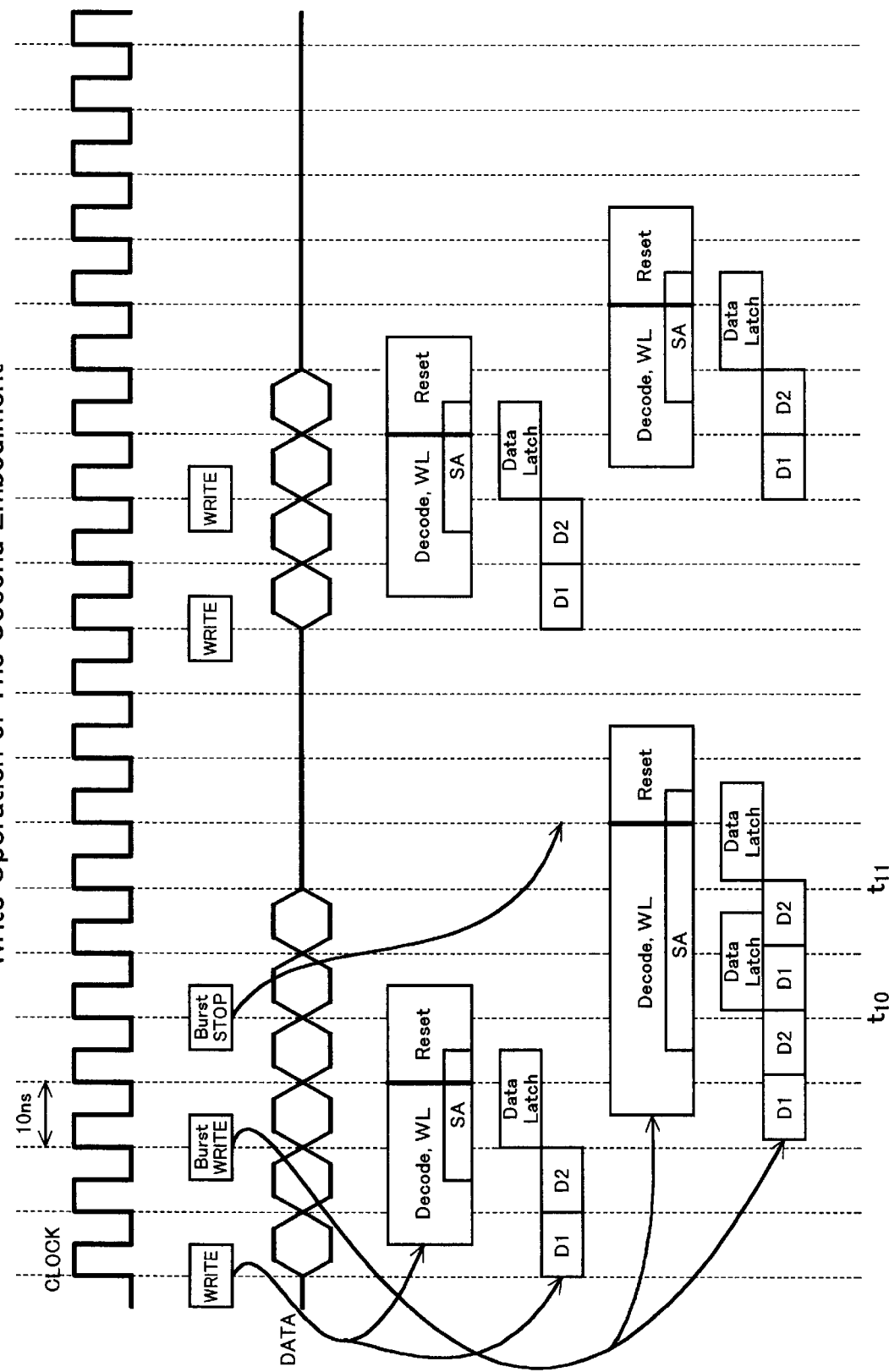
FIG. 14 is a timing chart of a write operation according to the second embodiment.

FIG. 14 is a timing chart of a write operation according to the second embodiment. In this example also, the burst length is 2. The standard write operation corresponding to a WRITE command is the same as that relating to the write A command illustrated in FIG. 9. However, when a burst write command BurstWRITE is supplied, write data is initially transferred from the third stage to the sense amplifier in the memory core selected by the supplied column address. Thereupon, at timing t11, two clocks of the burst length after timing t10 when the first data bit is transferred, a further 2 bits of readout data are transferred. This data is transferred to sense amplifiers selected by column addresses generated by the internal column address generating circuit 52, by incrementing the initial column address. Moreover, in response to the burst write command, the automatic reset circuit 18 inside the second stage 200 maintains the activated state of the sense amplifiers, without performing an automatic reset operation.

As described above, when a burst write command has been issued, column addresses are generated automatically inside the device, whilst maintaining the word line and sense amplifiers in an activated state, and a plurality of data bits corresponding to the burst length are transferred in parallel from the read/write buffer circuit 36 to the activated sense amplifiers selected according to the addresses thus generated. This transfer of plural data bits continues until a burst stop command BurstSTOP is issued and data transfer from the third stage 300 to the memory core 400 has been completed.

Moreover, the transfer rate is equal to the burst length× the frequency of the control clock in the data output circuit. In the example in FIG. 14, the data transfer cycle is 2 clock (20 ns). When a burst stop command is issued, the automatic reset circuit 18 deactivates the word line and sense amplifiers, and conducts a precharge operation. Thereby, the incrementing operation in the column address generating circuit 52 is halted.

In the write operation according to the second embodiment, when a burst write command has been supplied, a plurality of data bits is then transferred successively from the third stage circuit to the activated sense amplifiers, by using internally generated column addresses. In the second embodiment, when a burst write command is supplied, it is not necessary to operate the first stage or to perform word line and sense amplifier activation in the second stage, and hence data can be written at a faster rate. Although not illustrated, high-speed data writing can be conducted by shortening the data clock cycle, as demonstrated in FIGS. 10 and 11.

Third embodiment

In the first and second embodiments described above, special commands were defined in order to assume a column access mode where sense amplifiers are maintained in an activated state, without an automatic reset operation being performed. However, in the third embodiment, rather than using special commands, a transfer to column access mode inside the memory device is indicated by supplying a read command or write command followed by a read command or write command having the same row address, and moreover, issuing these commands at a faster timing than the cycle time in a standard random access operation. Therefore, circuitry for latching a row address and comparing it with the subsequent row address is provided in the memory device.

Figure 15:
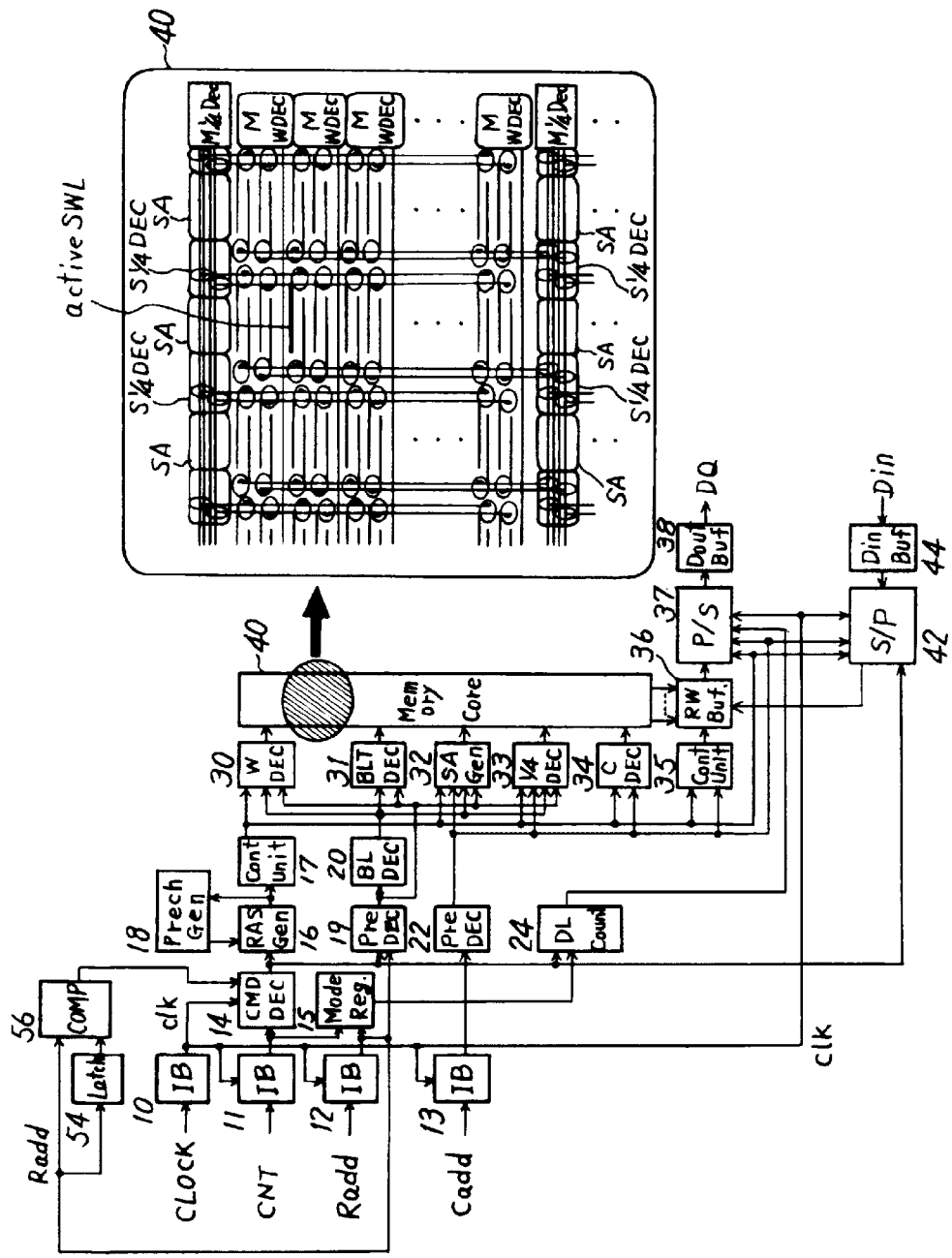
FIG. 15 is a block diagram of an FCRAM according to a third embodiment.

FIG. 15 is a block diagram of a FCRAM according to the third embodiment. Elements which are the same as those in FIG. 1 have been given the same reference numerals. As illustrated in FIG. 15, a row address latch circuit 54 for latching the row address Radd and a row address comparing circuit 56 for comparing this with the subsequent row address are provided, additionally. The comparison result from the row address comparing circuit 56 is supplied to the command decoder 14, which judges whether consecutive read commands or write commands have been supplied on the basis of this comparison result, and hence determines whether or not to prohibit the automatic reset operation.

Figure 16:
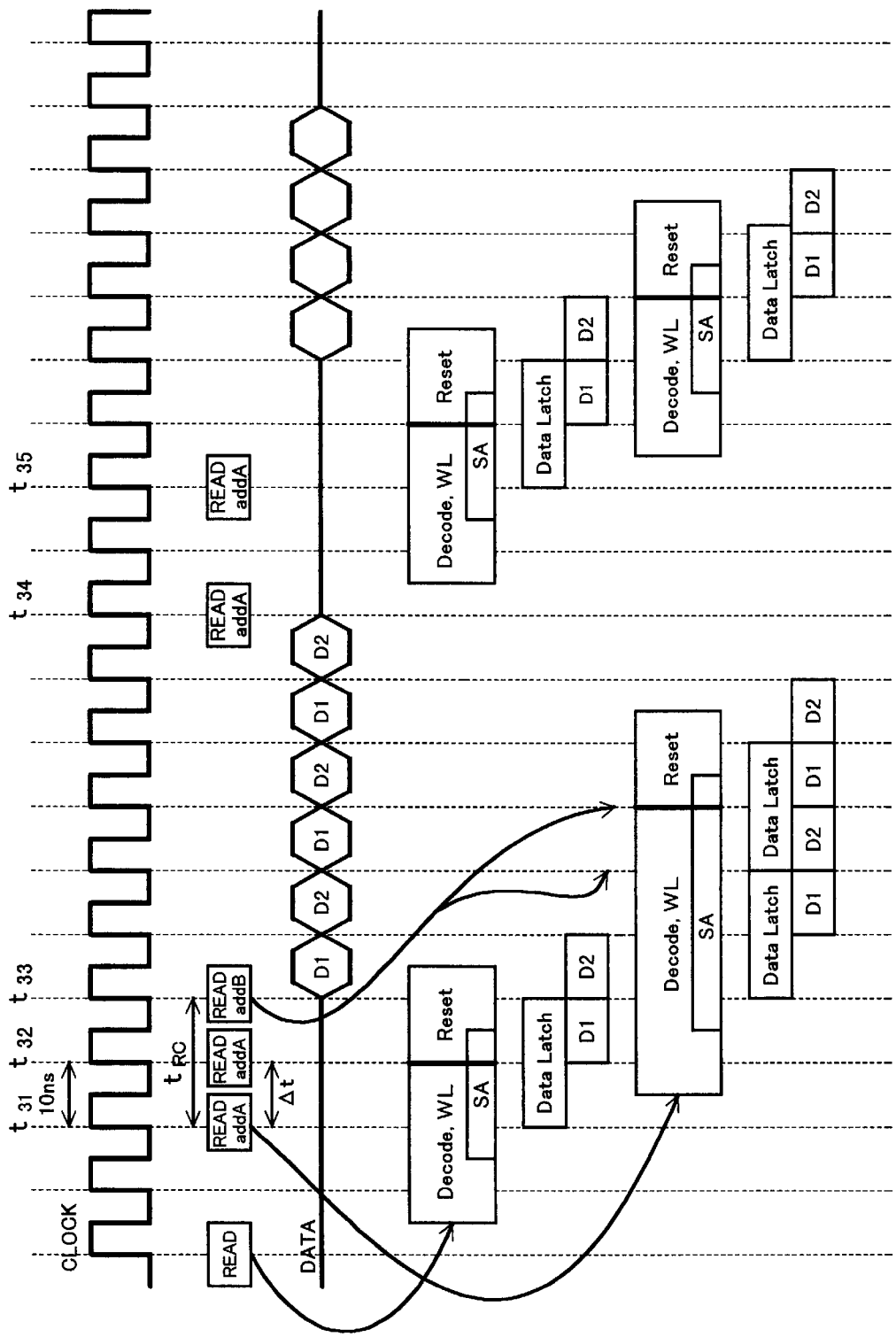
FIG. 16 is a timing chart of a readout operation according to a third embodiment.

FIG. 16 is a timing chart of a readout operation according to the third embodiment. In this example also, the burst length is 2. In the diagram, a read command READ associated with address A is supplied at timing t31. In response to this command, the first stage 100 performs a command decode and the second stage 200 activates a word line and sense amplifiers. Thereupon, data D1, D2 corresponding to the burst length (2 bits) are transferred in parallel from the memory core to the read/write buffer circuit 36.

Thereupon, at faster timing t32, which comes before the word line is deactivated, a subsequent read command, READ, is supplied in association with the same address A. In response to this, the row address comparing circuit 56 detects that the row address is the same, and furthermore, the command decoder 14 detects that the same read command has been supplied. As a result, an automatic reset operation corresponding to the read command supplied at timing t31 is prohibited, and the word line and sense amplifiers are maintained in an activated state. Moreover, no data is transferred from the memory core to the read/write buffer circuit 36 in response to the read command at timing t32.

Thereupon, if a READ command associated with address B is then supplied at timing t33, which is a standard cycle time of 20 ns after the initial read command (t31), the data D1, D2 in the sense amplifiers corresponding to this column address are transferred in parallel to the read/write buffer circuit 36, in accordance with the burst length (2 bits). In this case, a new operation of activating a word line and sense amplifiers is omitted. Thereupon, an automatic reset operation is conducted in response to the read command (t33).

If the read command supplied at timing t34 and the read command supplied at timing t35 in FIG. 16 are associated with the same row address, then although a judgement result indicating a matching row address is output by the row address comparing circuit 56, since the read commands are not supplied within a timing shorter than the normal interval, an automatic reset operation will be conducted for each of these read commands (t34, t35).

In the readout operation in FIG. 16, the external clock, CLOCK, is set to a cycle of 10 ns, but by increasing the cycle of the CLOCK to 5 ns, as shown in the example in FIG. 8, and supplying read commands in a 5 ns cycle also, it is possible to output data at a high rate. In other words, by supplying consecutive read commands having the same row address, the time required for the second stage to activate the word line and sense amplifiers can be saved, and hence data can be output at high speed by a column access operation.

The operation according to the third embodiment is controlled by the timing control circuit group illustrated in FIG. 18. When a signal indicating matching row addresses is supplied by the address comparing circuit 56, the command decoder 14 activates signal B. At the same time, the RAS generator 16 activates control signal φB1, which prohibits subsequent auto-precharge operations.

Next, the command decoder 14 activates signal C in response to the supplied read command. A column gate corresponding to the column address addB supplied with the read command is opened at the timing of a column gate control signal φCL generated in response to control signal φC1, and data in the activated sense amplifiers is transferred to the read/write buffer 36 and then output. The timing at which the column gate is opened does not involve activation of a word line or sense amplifiers, and hence it can be set to a faster timing than in standard operation.

If this read command also has a matching row address, then the command decoder 14 activates signal B once again. Thereby, the auto-precharge operation is prohibited and page mode operation is continued. If the row addresses do not match, then this indicates that page mode has terminated, and hence an auto-precharge operation is conducted.

Figure 17:
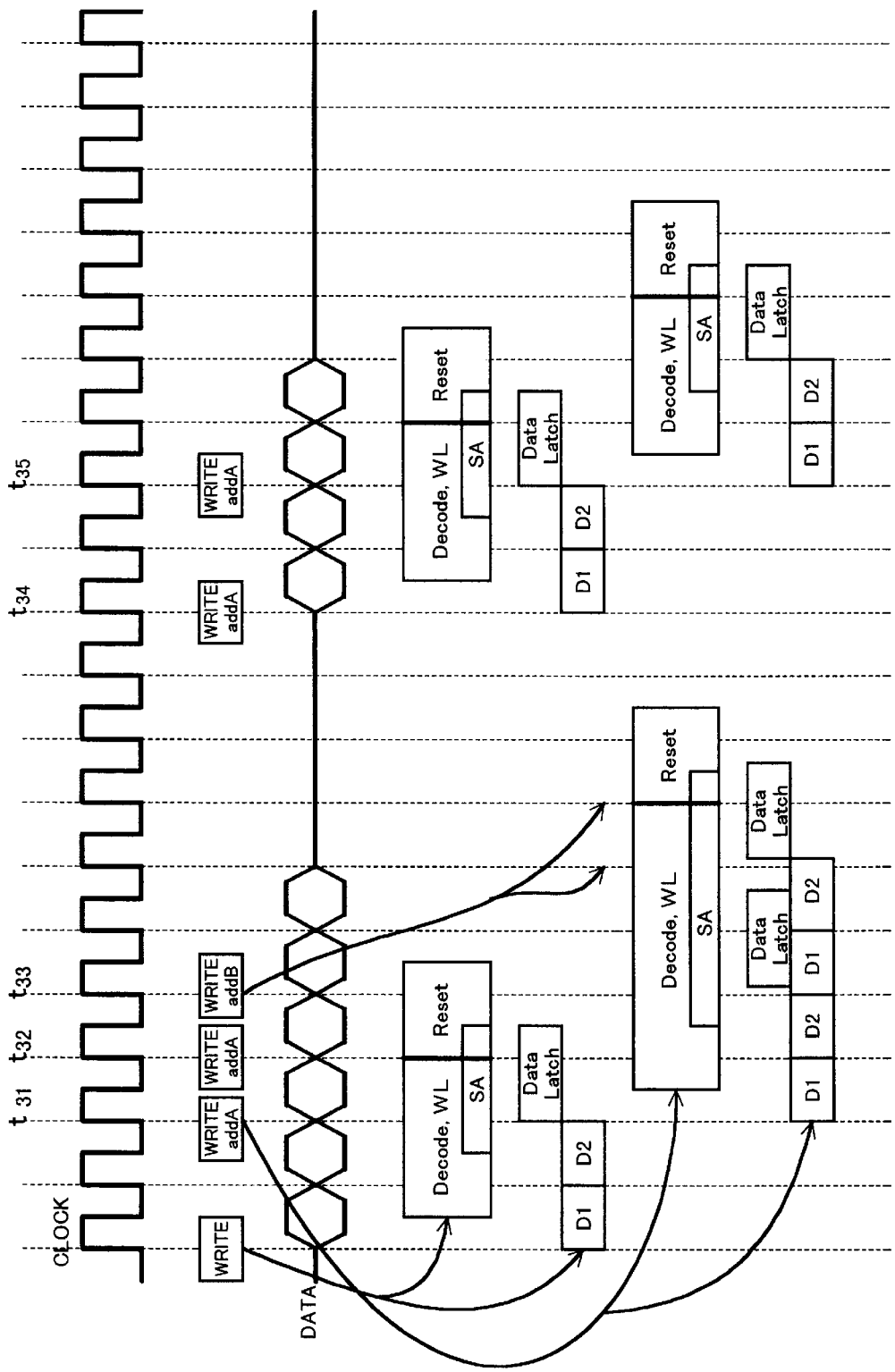
FIG. 17 is a timing chart of a write operation according to a third embodiment.

FIG. 17 is a timing chart of a write operation according to the third embodiment. The write operation illustrated in FIG.

17 is similar to the readout operation in FIG. 16. Namely, if write commands, WRITE, in association with the same row address are supplied consecutively at a faster timing than normal, the word line and sense amplifiers are maintained in an activated state without performing an automatic reset. In FIG. 17, a WRITE command associated with address A is supplied at timing t31, and when a further WRITE command associated with the same address A supplied at t31 is then issued, this is detected similarly to the operation in FIG. 16, and an automatic reset operation is not conducted in response to the write command at timing t31. The write operation corresponding to the write command at timing t33 is carried out with respect to a memory cell in a different column on the same word line, without a write operation corresponding to the write command at timing t32 being performed. Thereupon, an automatic reset operation is implemented.

When write commands associated with the same address are supplied consecutively at timings t34 and t35, since the subsequent write command is supplied at the normal timing, automatic reset operations are conducted respectively for each write command.

In the case of the write operation according to the third embodiment, the operation of the second stage is reduced. Therefore, as illustrated in FIG. 11, it is possible to supply and write data in a 5 ns cycle, by using a high-speed external clock and supplying a write command associated with the same address at a 5 ns interval.

Moreover, if a write command associated with the same row address is supplied at timing t33, then the activated state of the sense amplifiers will again be maintained without performing an automatic reset, and the column access operation will be continued.

As described above, according to the present invention, in a FCRAM providing a short cycle time for random address operations, it is possible to conduct data transfer between a memory core and input/output circuits at high speed, without performing an automatic reset operation in relation to the read command or write command, and without activating the word line and sense amplifiers at the subsequent read command or write command. Therefore, if read or write operations are performed consecutively with respect to memory cells on the same word line, high-speed operation can be achieved. In this case, data corresponding to the burst length can be transferred simultaneously in parallel, by maintaining activation of the sense amplifiers, and hence data readout and write operations can be carried out at higher speeds than in conventional page mode or burst mode.

According to the present invention, it is possible to provide an FCRAM wherein the speed of random address operations can be increased, and moreover the speed of read and write operations with respect to memory cells on the same word line can also be increased.

What is claimed is:

1. A memory device comprising:

a first stage for performing command decoding, a second stage for performing sense amplifier activation, and a third stage for performing data input or output, configured in a pipeline structure, a plurality of data bits being transferred in parallel between said sense amplifiers and said third stage;

wherein said second stage deactivates said sense amplifiers so as to perform a reset operation, after data has been transferred in parallel between said sense amplifiers and said third stage, in response to a first read or write command; and said second stage maintains the activated state of said sense amplifiers so as not to perform said reset operation, after data has been transferred in parallel between said sense amplifiers and said third stage, in response to a second read or write command.

2. The memory device according to claim 1:

wherein, in response to said first or second read or write command supplied following said second read or write command, data is transferred in parallel between said sense amplifiers maintained in an activated state and said third stage.

3. The memory device according to claim 1:

wherein, in response to said first read or write command supplied following said second read or write command, said second stage deactivates said sense amplifiers so as to perform said reset operation after data has been transferred in parallel between the sense amplifiers in said activated state and said third stage.

4. The memory device according to claim 1:

wherein said third stage comprises a parallel-serial converting circuit for outputting a plurality of data bits transferred in parallel from said sense amplifiers, to an output terminal in a serial fashion, and a serial-parallel converting circuit for outputting a plurality of data bits input serially via an input terminal to said sense amplifiers, in parallel.

5. The memory device according to claim 1 further comprising;

a row address latch circuit for holding the row address supplied along with said first read or write command.

6. A memory device comprising:

a first stage for performing command decoding, a second stage for performing sense amplifier activation, and a third stage for performing data input or output, configured in a pipeline structure, a plurality of data bits being transferred in parallel between said sense amplifiers and said third stage;

wherein said second stage deactivates said sense amplifiers so as to perform a reset operation, after data has been transferred in parallel between said sense amplifiers and said third stage, in response to a first read or write command; and in response to a second read or write command, said second stage maintains the activated state of said sense amplifiers without performing said reset operation, after data has been transferred in parallel between said sense amplifiers and said third stage, and then the column address is incremented and data is transferred in parallel between said third stage and sense amplifiers corresponding to the incremented column address.

7. The memory device according to claim 6;

wherein , in response to a halt command for said second read or write command, said second stage deactivates said sense amplifiers so as to perform said reset operation, after data has been transferred in parallel between said third stage and said sense amplifiers corresponding to said incremented column address.

8. The memory device according to claim 6;

wherein said second stage comprises a column address generating circuit for incrementing said column address.

9. The memory device according to claim 6;

wherein said third stage comprises a parallel-serial converting circuit for outputting a plurality of data bits transferred in parallel from said sense amplifiers, to an output terminal in a serial fashion, and a serial-parallel converting circuit for outputting a plurality of data bits input serially via an input terminal to said sense amplifiers, in parallel.

10. A memory device comprising:

a first stage for performing command decoding, a second stage for performing sense amplifier activation, and a third stage for performing data input or output, configured in a pipeline structure, a plurality of data bits being transferred in parallel between said sense amplifiers and said third stage;

wherein said second stage deactivates said sense amplifiers so as to perform a reset operation, after data has been transferred in parallel between said sense amplifiers and said third stage, in response to a read or write command; and when read or write command associated with the same row address is supplied consecutively within a timing shorter than a standard command cycle, said second stage maintains the activated state of said sense amplifiers so as not to perform said reset operation, regardless of the immediate preceding read or write command.

11. The memory device according to claim 10;

wherein said first stage comprises a row address comparing circuit for comparing consecutively supplied row addresses.

12. The memory device according to claim 10;

wherein said third stage comprises a parallel-serial converting circuit for outputting a plurality of data bits transferred in parallel from said sense amplifiers, to an output terminal in a serial fashion, and a serial-parallel converting circuit for outputting a plurality of data bits input serially via an input terminal to said sense amplifiers, in parallel.

* * * * *